(12) United States Patent
Hamano et al.

(10) Patent No.: US 10,910,914 B2
(45) Date of Patent: Feb. 2, 2021

(54) ELECTRIC POWER TOOL

(71) Applicant: MAX CO., LTD., Tokyo (JP)

(72) Inventors: Terufumi Hamano, Tokyo (JP); Hiroki Ishiguro, Tokyo (JP); Yusuke Yoshida, Tokyo (JP)

(73) Assignee: MAX CO., LTD., Tokyo (JP)

( * ) Notice: Subject to any disclaimer, the term of this patent is extended or adjusted under 35 U.S.C. 154(b) by 168 days.

(21) Appl. No.: 16/276,901

(22) Filed: Feb. 15, 2019

(65) Prior Publication Data

US 2019/0280558 A1 Sep. 12, 2019

(30) Foreign Application Priority Data

Feb. 16, 2018 (JP) ................................ 2018-025865
Jan. 15, 2019 (JP) ................................ 2019-004097

(51) Int. Cl.
| | |
|---|---|
| *H02K 11/00* | (2016.01) |
| *H02K 7/14* | (2006.01) |
| *H02K 7/00* | (2006.01) |
| *H05K 1/18* | (2006.01) |
| *B65B 13/18* | (2006.01) |
| *H02K 11/33* | (2016.01) |

(52) U.S. Cl.
CPC ........... *H02K 7/145* (2013.01); *B65B 13/187* (2013.01); *H02K 7/003* (2013.01); *H02K 11/33* (2016.01); *H05K 1/181* (2013.01); *H05K 2201/1009* (2013.01)

(58) Field of Classification Search
CPC ........ H02K 7/145; H02K 11/33; H02K 5/225; H02K 2203/09; H02K 2211/03; H02K 2203/03; H02K 23/66; H02K 11/30

USPC ............................................ 310/68 R, 71, 50
See application file for complete search history.

(56) References Cited

U.S. PATENT DOCUMENTS

| | | | |
|---|---|---|---|
| 2017/0214292 A1* | 7/2017 | Nagahama | .......... H01M 10/488 |
| 2018/0029179 A1 | 2/2018 | Orendi et al. | |
| 2018/0187433 A1* | 7/2018 | Itagaki | .................... B21F 15/04 |
| 2018/0342928 A1* | 11/2018 | Ekstrom | ................ H01C 10/38 |

(Continued)

FOREIGN PATENT DOCUMENTS

| | | |
|---|---|---|
| EP | 2 929 986 A2 | 10/2015 |
| EP | 3 162 513 A2 | 5/2017 |

(Continued)

OTHER PUBLICATIONS

European Search Report issued in Application No. 19157476.3, dated Sep. 4, 2019, 8 pages.

*Primary Examiner* — Thanh Lam
(74) *Attorney, Agent, or Firm* — Rothwell, Figg, Ernst & Manbeck, P.C.

(57) ABSTRACT

An electric power tool includes a driving unit generating a driving force by electricity and various components functioning by electricity, a circuit board on which a control unit configured to control the driving unit and the various components is mounted, a plurality of connectors connecting a plurality of wirings, which extend from the driving unit and the various components, with a plurality of wirings, which extend from the circuit board, a body portion installed therein with the driving unit, the various components, the circuit board and the plurality of connectors, and a receiving portion which receives the plurality of connectors therein and which is fixed to the body portion.

13 Claims, 15 Drawing Sheets

(56) References Cited

U.S. PATENT DOCUMENTS

2018/0342932 A1* 11/2018 Wachter ................ B25F 5/008
2019/0257098 A1*  8/2019 Hamano ................ E04G 21/16

FOREIGN PATENT DOCUMENTS

EP       3 278 935 A2    2/2018
JP         5217621 B2    6/2013

* cited by examiner

ELECTRIC POWER TOOL

CROSS-REFERENCE TO RELATED APPLICATION

This application claims priorities from Japanese patent applications No. 2018-025865 filed on Feb. 16, 2018 and No. 2019-004097 filed on Jan. 15, 2019, the entire contents of which are incorporated herein by reference.

TECHNICAL FIELD

The technology disclosed herein relates to an electric power tool.

BACKGROUND

In order to make a work more efficient, various electric power tools are used. Such electric power tools include, for example, a binding machine and the like (see Patent Document 1). For example, the binding machine is used to bind an object, such as reinforcing bars, at a construction site and the like. By using the binding machine, the work can be reliably speeded up. Thus, it is expected that the binding machine will come into wide use in the future.

[Patent Document 1] Japanese Patent No. 5217621

SUMMARY

Such electric power tools include, in a body portion thereof, a driving unit, such as a motor; various components, such as sensors or LEDs; a circuit board, on which a control unit is mounted; wirings and connectors for electrically connecting therebetween and the like. Among them, the connectors are often received in an empty space inside the body portion by pushing the connectors into the space due to routing of wirings. As a result, assemblability or maintainability of the connectors or wirings to the body portion is not good. Accordingly, an object of the technology disclosed herein is mainly to solve the above problems.

In order to solve the problems an electric power tool of the present disclosure comprising:

a driving unit generating a driving force by electricity and various components functioning by electricity;

a circuit board on which a control unit configured to control the driving unit and the various components is mounted;

a plurality of connectors connecting a plurality of wirings, which extend from the driving unit and the various components, with a plurality of wirings, which extend from the circuit board;

a body portion installed therein with the driving unit, the various components, the circuit board and the plurality of connectors; and a receiving portion which receives the plurality of connectors therein and which is fixed to the body portion.

According to the electric power tool, a plurality of connectors, which would have been simply pushed into the empty space inside the body portion due to routing of wirings, can be received in the receiving portion and then fixed to the body portion. Therefore, it is possible to enhance assemblability or maintainability of connector portions.

BRIEF DESCRIPTION OF THE DRAWINGS

FIG. 11A is a side view, FIG. 11B is a bottom view, FIG. 11C is a sectional view take along an A-A line in FIG. 11A, and FIG. 11D is a perspective view.

FIG. 13A is a perspective view, FIG. 13B is a side view, and FIG. 13C is a sectional view taken along a B-B line in FIG. 13B.

DETAILED DESCRIPTION

Hereinafter, the present embodiment will be described in detail with reference to the accompanying drawings. FIGS. 1 to 13B are intended to describe the present embodiment.

Embodiment 1

<Configuration> Hereinafter, a configuration of the present embodiment will be described.

Figure 1:
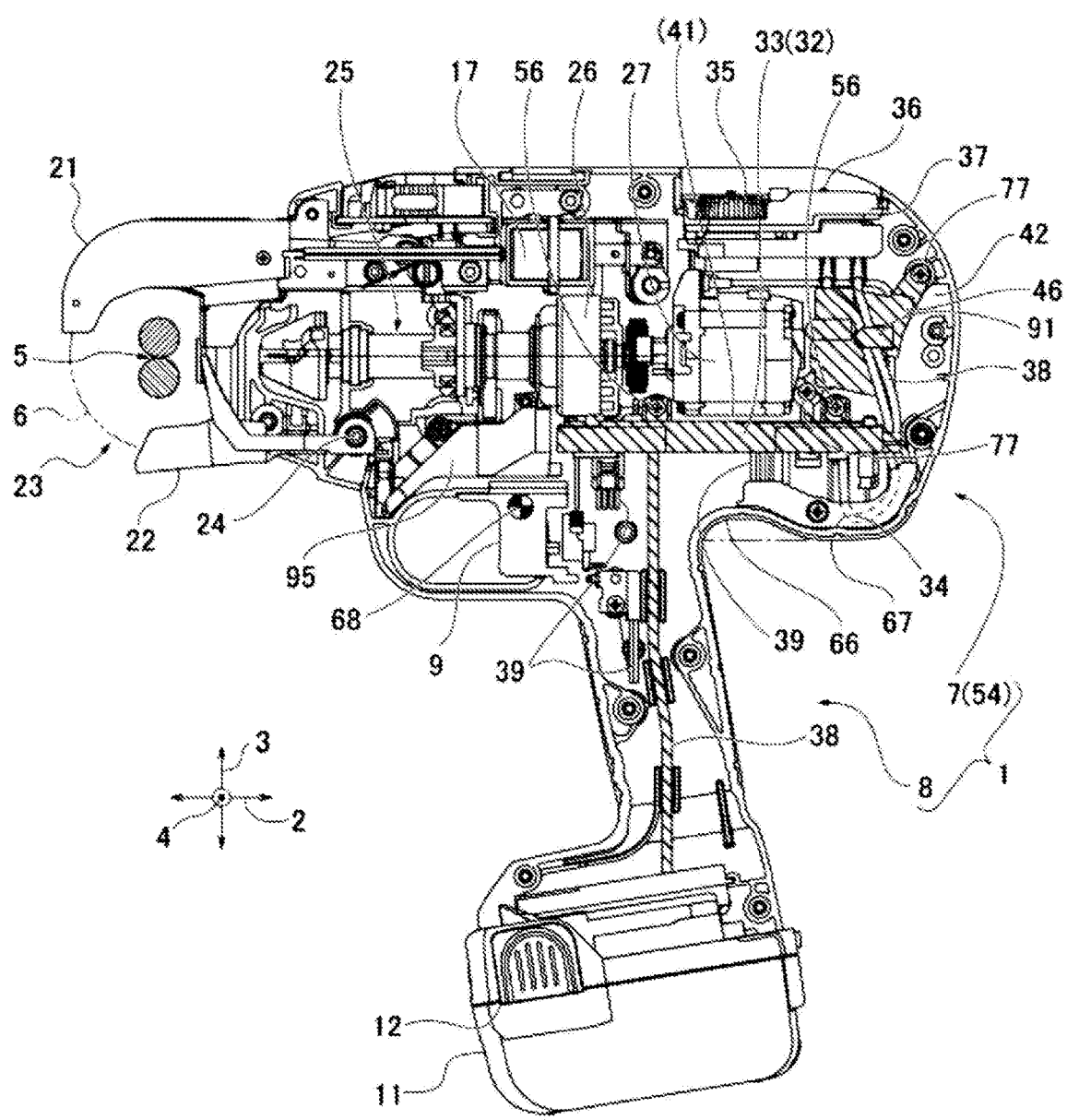
FIG. 1 is a view showing an interior structure of an electric power tool (binding machine) according to the present embodiment, as viewed from the side.

FIG. 1 shows a binding machine 1 as an example of an electric power tool. Arrows in the figure represent, respectively, a first direction 2 corresponding to a horizontal direction of the binding machine 1, a second direction 3 perpendicular to the first direction 2 and also corresponding to a vertical direction of the binding machine 1, and a third direction 4 perpendicular to the first direction 2 and the second direction 3 and also corresponding to a widthwise direction of the binding machine 1.

The binding machine 1 is an electric power tool intended to bind an object or a work piece, such as reinforcing bars 5, with a binding member, such as a wire 6. The binding machine 1 includes a twisting unit 25 configured to twist a binding member, such as a wire 6, which is guided in a loop shape to wrap around an object, such as reinforcing bars 5, and thus to bind the object, such as reinforcing bars 5; a twist motor 27 for driving the twisting unit 25; a circuit board 32 having a mounting surface 32a, on which a control unit 40 (see FIG. 6) for controlling the twist motor 27 is mounted; a body portion 7 for housing the twisting unit 25, the twist motor 27 and the circuit board 32. A handle portion 8 extending outward, i.e., substantially in the second direction 3, is provided on the substantially middle part of the body portion 7 in the first direction 2. The body portion 7 has a generally hollow case extending in the first direction 2. In the following, reinforcing bars 5 as the object and a wire 6 as the binding member will be described by way of example. Also, in the first direction 2, a side of the body portion 7 facing the reinforcing bars 5 is referred to a front side of the body portion 7, and the opposite side thereof is referred to as a rear side of the body portion 7. Further, in the second direction 3, a side of the body portion 7, on which the handle portion 8 is provided, is referred to as a lower side of the body portion 7, and the opposite side thereof is referred to as a upper side of the body portion 7. Meanwhile, it should be noted that the body portion 7 can be oriented in various directions depending on a working posture of the binding machine 1 and thus the front/rear sides and the upper/lower sides are relative. The third direction 4 is a direction corresponding to a left and right direction of a worker, who holds the binding machine 1, and is represented as a direction perpendicular to the paper surface of the figure (the far side is the right side and the near side is the left side).

The handle portion 8 is provided on the body portion 7 for the purpose of easily performing a work while holding the binding machine 1. Thus, in order to easily grip the handle portion 8, the handle portion 8 is attached on the body portion 7 at an angle slightly inclined toward the front side of the body portion 7 in the first direction 2. The handle portion 8 is formed by a generally hollow member. In the following, a portion (upper end portion) of the handle portion 8 facing the body portion 7 is referred to as a base portion or root portion of the handle portion 8, and the opposite portion thereof (lower end portion) is referred to as a distal end portion of the handle portion 8. Electric components, such as a trigger switch 9 as an activation switch, are provided on a front side of the root portion of the handle portion 8. Also, a battery 11 as a power supply is detachably attached on the distal end portion of the handle portion 8 via a battery attaching portion 12. Then, the binding machine 1 is activated by pulling the trigger switch 9 in a state where the binding machine 1 is turned on.

On a lower portion of the body portion 7, which is located in the rear of the handle portion 8, a load supporting portion 67 may be provided to be placed on the back of a worker's hand and thus to support a load. At a location, which is located in front of the load supporting portion 67 but in the rear of the root portion of the handle portion 8, a recessed portion 66 may be provided by scraping out the entire lower portion of the body portion 7 to allow the back of the hand gipping the handle portion 8 to be inserted therein. By providing the recessed portion 66 in this way, the handle portion 8 (and thus a gripping position thereon) relative to the body portion 7 can be provided to be closer to the upper side or center portion of the body portion 7 than the existing one. Correspondingly, a position of the middle finger when the handle portion 8 is gripped (a location in the vicinity of a lower end of the trigger switch 9) can be brought closer to the centroid position 68 of the binding machine 1 than before. Accordingly, a weight balance of the binding machine 1 can be improved and also operability of the binding machine 1 can be enhanced. Meanwhile, the centroid position 68 of the binding machine 1 is determined by a weight of the body portion 7 and a weight of the battery 11 and generally corresponds to the position as shown in FIG. 1 and the like.

The binding machine 1 is configured to bind the reinforcing bars 5 by twisting the wire 6, which is guided in a loop shape to wrap around the reinforcing bars 5. The wire 6 is consumables and thus the wire 6 wound around a reel 13 (see FIG. 8) can be used. The body portion 7 is provided, on the rear portion thereof (e.g., on the right side thereof), with a mount portion (reel mount portion) 14 (see FIG. 8) allowing the reel 13 to be rotatably mounted thereon. The mount portion 14 is provided with a reel detection unit having electric components, such as a sensor capable of detecting an attached or detached state of the reel 13. The reel detection unit is attached on the body portion 7 while being mounted on a sub-board. The mount portion 14 is provided with a brake unit for regulating rotation of the reel 13. The brake unit is configured to brake rotation of the reel 13, for example, at a time when delivery of the wire 6 is ended. The brake unit has a driving portion such as a solenoid 17. The driving portion such as the solenoid 17 is attached on the substantially middle portion (an upper portion thereof) of the body portion 7. The wire 6 drawn out from the reel 13 mounted on the mount portion 14 is delivered to the front side of the body portion 7 by a wire feeding unit 18 (see FIG. 8). The wire feeding unit 18 is provided on the substantially middle portion of the body portion 7. The wire feeding unit 18 has a driving portion constructed by an electric motor, such as a feeding motor 18a (see FIG. 8), and feeding gears driven by the feeding motor 18a.

The body portion 7 is provided, on a front end portion thereof, with curl guides 21, 22 configured to curl the wire 6 and then to guide the wire 6 in a loop shape around the reinforcing bars 5. The wire 6 is guided by the curl guides 21, 22 in such a manner that the wire 6 is wrapped in one turn or a plurality of turns around the reinforcing bars 5. The curl guides 21, 22 are provided in a pair while having a gap therebetween in the vertical direction (second direction 3) of the binding machine 1. Since the reinforcing bars 5 have to be inserted between the pair of curl guides 21, 22, an opening portion (insertion portion) 23 is provided therebetween. The pair of curl guides 21, 22 are provided to have different lengths in such a manner that the upper side (curl guide 21) is longer and the lower side (curl guide 22) is shorter. The upper curl guide 21 is fixed (fixed curl guide). The lower curl guide 22 may be fixed or movable (movable curl guide). In the present embodiment, the lower curl guide 22 is attached on the body portion 7 to be pivotable in the second direction, i.e., in the vertical direction, about a curl guide shaft 24 extending in the third direction 4.

The body portion 7 is provided with the twisting unit 25 configured to perform binding by twisting the loop-shaped wire 6 wound around the reinforcing bars 5 to reduce a diameter of the loop. The twisting unit 25 is formed in a generally shaft shape extending in the first direction 2. The twisting unit 25 is connected to an output shaft of the twist motor 27, which protrudes from one end side thereof, via a speed reduction mechanism 26. Then, the twisting unit 25 is operated by rotationally driving the twist motor 27.

Various driving portions installed in the binding machine 1, such as the feeding motor 18a, the twist motor 27 and the solenoid 17, are sequentially controlled by the control unit 40. The control unit 40 is mounted on the circuit board 32 (control board or main board). The circuit board 32 is installed between the twist motor 27 inside the body portion 7 and an inner wall surface 34 thereof facing the handle portion 8, while being received in a circuit board case 33. The circuit board case 33 is formed as a shallow dish or flat box-shaped container having, on one face thereof, an opening portion allowing the circuit board 32 to be received therein. As viewed in a plan view, the circuit board 32 has a generally quadrangular shape, and a shape of the circuit board case 33 in the plan view is generally similar to that of the circuit board 32. The circuit board case 33 is fixed to a side surface of the body portion 7 (a first body portion 54 as described below) by fixing portions 56. Also, the binding machine 1 is installed with a setting unit 35 capable of setting operation conditions of the binding machine 1, specifically operation conditions of various driving portions, such as the feeding motor 18a, the twist motor 27 and the solenoid 17. For example, the setting unit 35 is configured to set the number of turns of the wire 6 wound around the reinforcing bars 5, an operation time of the feeding motor 18a, an operation timing of the solenoid 17, an amount of torque of the twist motor 27 and the like. The setting unit 35 is mounted on a switch board 37, together with electric components, such as a main power switch or main switch 36 for turning on and off the power supply. Also, various driving portions, such as the feeding motor 18a, the twist motor 27 and the solenoid 17; various circuit boards, such as the circuit board 32 (main board), the switch board 37 and the sub-board; and a battery 11 (a battery board provided inside the battery), which are installed in the binding machine 1, are connected to each other by various wirings. The various wirings include, for example, power supply wirings 38, signal wirings 39 and the like. The wirings, such as power supply wirings 38 and signal wirings 39, are arranged inside the body portion 7.

With respect to the basis configuration as described above, the electric power tool of the present embodiment is configured as follows.

(1) The electric power tool of the present embodiment includes a driving unit generating a driving force by electricity and various components functioning by electricity; a circuit board 32, on which a control unit 40 for controlling the driving unit and the various components is mounted; a plurality of connectors 71a to 71c (see FIGS. 2A to 2C) for connecting a plurality of wirings 72a to 72c (see FIGS. 2A to 2C), which extend from the driving unit and the various components, with a plurality of wirings 72a to 72c, which extend from the circuit board 32; a body portion 7 installed therein with the driving unit, the various components, the circuit board 32 (see FIG. 6) and the plurality of connectors 71a to 71c; and a receiving portion 46 configured to receive the plurality of connectors 71a to 71c therein and to be fixed to the body portion 7.

Herein, the electric power tool is not limited to the binding machine 1 as described above, but the structure of the present embodiment can be appropriately applied to the binding machine 1. The body portion 7 is configured to be dividable into a first body portion 54 and a second body portion 55 in the widthwise direction (third direction 4 or left and right direction) (see FIG. 5). In the case of the binding machine 1, the driving unit is the solenoid 17 of the brake unit, the feeding motor 18a of the wire feeding unit 18, the twist motor 27 for driving the twisting unit 25 or the like, in particular the twisting motor 27. In the case of the binding machine 1, the components includes the sensor of the reel detection unit, the trigger switch 9, the setting unit 35, the main switch 36, a light source, such as a LED, for indicating an on/off state of the main switch 36, or the like.

Figure 2A:
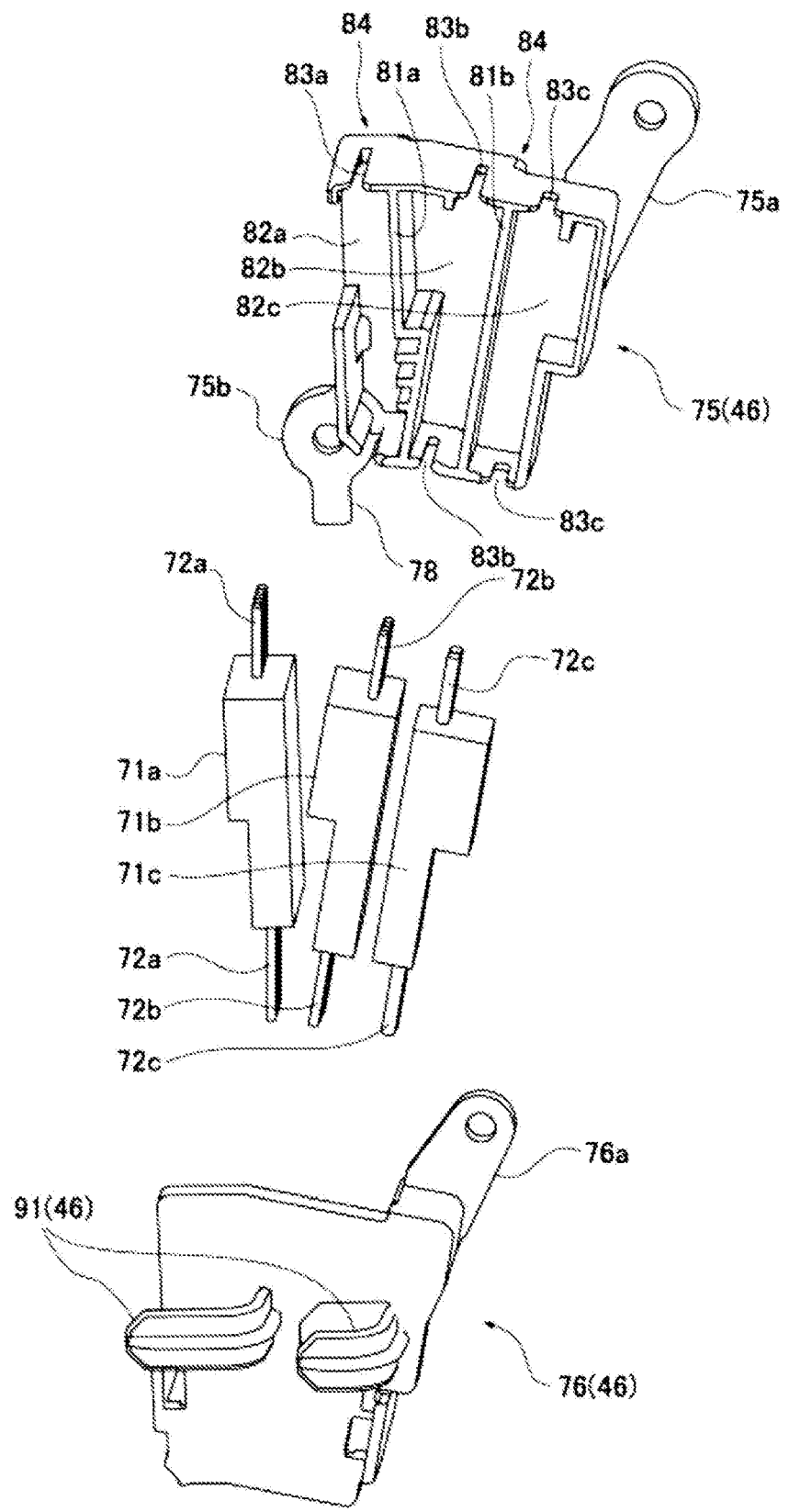
FIG. 2A is an exploded perspective view showing a state before connectors are received in a receiving portion of FIG. 1.
Figure 2B:
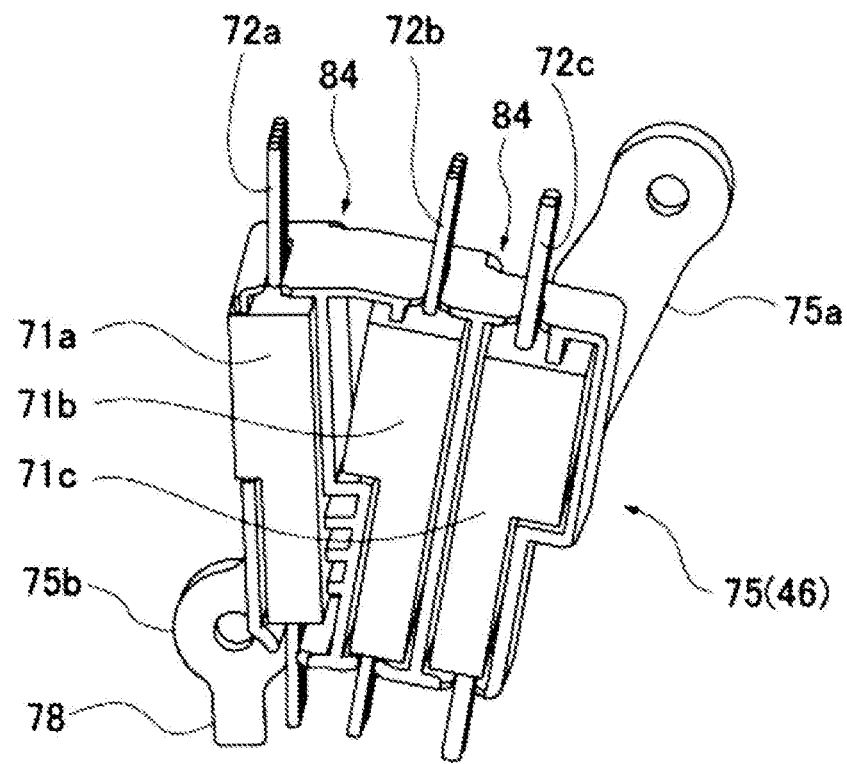
FIG. 2B is an exploded perspective view of the receiving portion subsequent to FIG. 2A.
Figure 2B:
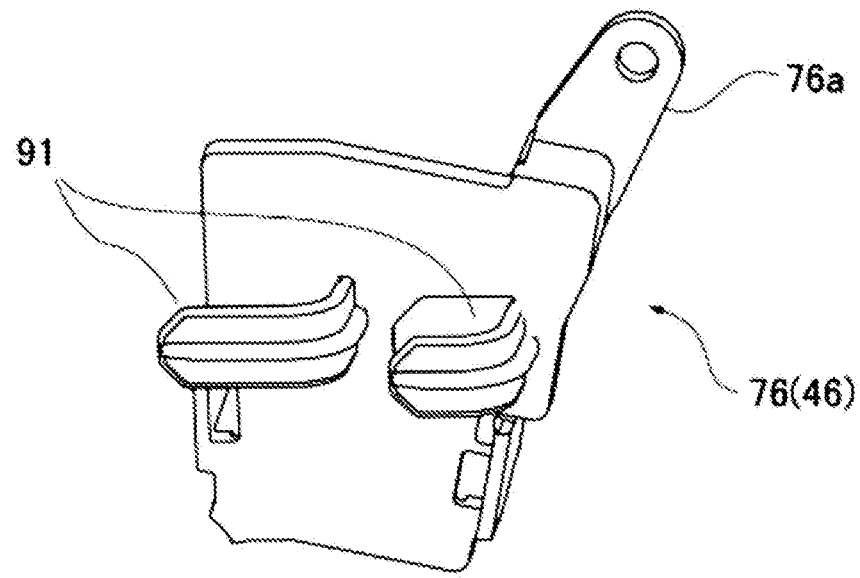
Figure 2C:
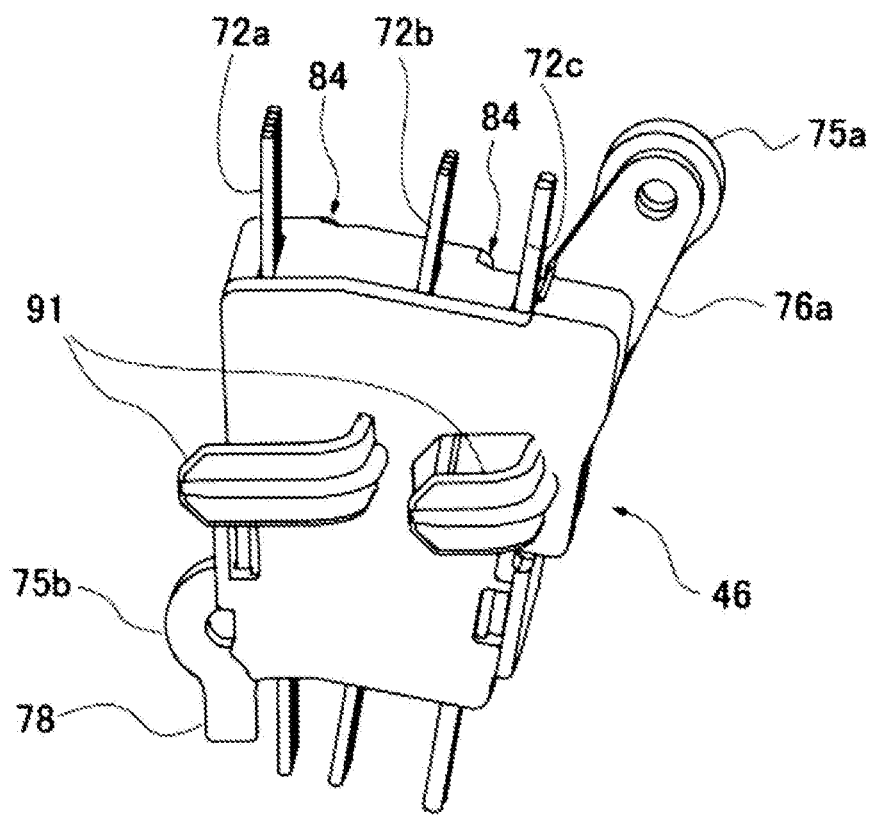
FIG. 2C is an overall perspective view of the receiving portion, in which the connectors are received.

As shown in FIGS. 2A to 2C, the connectors 71a to 71c are provided singularly or in plural on an end portion or a middle portion of wirings 72a to 72c constituting the power supply wirings 38, the signal wirings 39 or the like. The connectors 71a to 71c may be individual connectors capable of individually connecting wirings one by one, but in the present embodiment, are configured as a collective connector capable of collectively connecting a plurality of wirings 72a to 72c at once. For example, a plurality of connectors 71a to 71c can be separately provided for each number of wirings 72a to 72c, for each thickness of wirings, for each component (or board) to be connected, or the like. In the present embodiment, a first connector 71a is provided to be capable of connecting five first wirings 72a having the thinnest thickness at once. Also, a second connector 71b is provided to be capable of connecting four second wirings 72b having a medium thickness (thicker than the first wirings 72a but thinner than third wirings 72c) at once. A third connector 71c is provided to be capable of connecting two third wirings 72c having the thickest thickness in the figures at once. However, the number of connectors 71a to 71c is not limited to three. Also, the connectors 71a to 71c in the figures are shown in a state where male connectors and female connectors are connected to each other.

The receiving portion 46 is configured in the shape of a box capable of receiving a plurality of connectors 71a to 71c. The receiving portion 46 is at least constituted of a container portion 75 having an opening portion in one surface thereof, and a lid portion 76 for closing the opening portion of the container portion 75. The lid portion 76 is capable of closing or opening the container portion 75 in the widthwise direction (third direction 4) of the body portion 7. The container portion 75 and the lid portion 76 are fixed to each other by claws or screws. The receiving portion 46 is fixed to the body portion 7 in the widthwise direction by fixtures 77 such as screws (see FIG. 1), while the receiving portion 46 is received inside the body portion 7. Therefore, attaching pieces 75a, 75b having a screw hole are respectively integrally provided on upper and lower portions of the container portion 75. Also, on an upper portion of the lid portion 76, an attaching piece 76a is integrally provided to be fastened together with the upper attaching piece 75a of the container portion 75. On a lower portion of the lid portion 76, no attaching piece or the like is provided. In this configuration, by temporarily loosely fixing the lower attaching piece 75b of the container portion 75 to the body portion 7 by means of the fixture 77, the container portion 75 is allowed to be pivotally displaced (rearward) about the attaching piece 75b. Also, for example, it is possible to attach the connectors 71a to 71c to the container portion 75 while the container portion 75 is brought out of the body portion 7. If the connectors 71a to 71c have been attached to the container portion 75, the lid portion 76 is attached to the container portion 75, so that the connectors 71a to 71c are received in the receiving portion (first receiving portion) 46. Thereafter, the receiving portion 46 is moved to a defined position inside the body portion 7 (by pivotally displacing the receiving portion 46 forward about the attaching piece 75b). Then, the attaching piece 75a, 76a are finally fixed to the body portion 7 by means of the fixtures 77, and also the attaching piece 75b is finally fixed to the body portion 7 by the fixture 77. By adopting such a mounting method, it is possible to simplify the work and also to shorten the wirings 72a to 72c.

At this time, a wiring restriction portion 78 may be provided on the receiving portion 46. For example, the wiring restriction portion 78 can be configured as a wiring arranging arm protruding from the lower attaching piece 75b of the container portion 75 downward (toward the circuit board case 33 below thereof). The wiring restriction portion 78 is intended to restrict wirings (e.g., power supply wirings 38 in FIG. 5), which extend from lower to upper side by passing outside the receiving portion 46 after emerging, for example, from the circuit board 32, the circuit board case 33 and the like, and thus to arrange a flow or direction of the wirings. Accordingly, for example, by fixing the receiving portion 46 to the first body portion 54 constituting the body portion 7, the wiring restriction portion 78 can naturally control wirings in the vicinity thereof, in such a manner that the wirings are guided outside the receiving portion 46. As a result, it is possible to enhance assemblability or maintainability of the wirings to the body portion 7 or the container portion 75.

Also, the receiving portion 46 may be formed of an opaque member, but the receiving portion 46 may be entirely or partially formed of a transparent member or translucent member. Thus, a received state of the connectors 71a to 71c in the receiving portion 46 can be visually identified. Therefore, it is possible to find and prevent defects, such as biting of the connectors 71a to 71c by the receiving portion 46 or poor connection of the connectors 71a to 71c.

(2) As shown in FIG. 1, the receiving portion 46 is arranged in the rear of the driving unit, i.e., the receiving portion 46 is arranged on the opposite side to the output shaft of the twist motor 27.

The twisting unit 25 is installed at a location inside the body portion 7, which is located in front of the twist motor 27, via the speed reduction mechanism 26, and a rear space 42 is formed in the rear of the twist motor 27. The receiving portion 46 is installed in the rear space 42. The circuit board 32 is arranged to be close to the twist motor 27. In the binding machine 1, the circuit board 32 is the above main board. The circuit board 32 is arranged upside down in such a manner that the mounting surface 32a (see FIG. 6) faces the handle portion 8 and the back surface (soldering surface) thereof faces the twist motor 27. The circuit board 32 is arranged between the twist motor 27 and the handle portion 8 in such a manner that the circuit board 32 is closer to the twist motor 27 than the inner wall surface 34 (bottom wall) of the body portion 7, which is located toward the handle portion 8. For example, on the basis of the curl guide shaft 24 positioned between the inner wall surface 34 and the twist motor 27 (in the second direction 3), the circuit board 32 is arranged at a height substantially equal to or higher than that of the curl guide shaft 24. A heat resistant member, such as a heat resistant sheet 41 (see FIG. 1), may be interposed between the circuit board 32 and the twist motor 27 as required. The heat resistant sheet 41 can be installed by attaching rubber or resin on an upper surface of the circuit board case 33. In this way, by interposing the heat resistant member, such as the heat resistant sheet 41, between the circuit board 32 and the twist motor 27, it is possible to protect the circuit board 32 from heat generated by the twist motor 27. Also, since the heat resistant sheet 41 is formed of rubber, resin or the like, the effect thereof as a vibration-proof material can be anticipated.

Figure 3A:
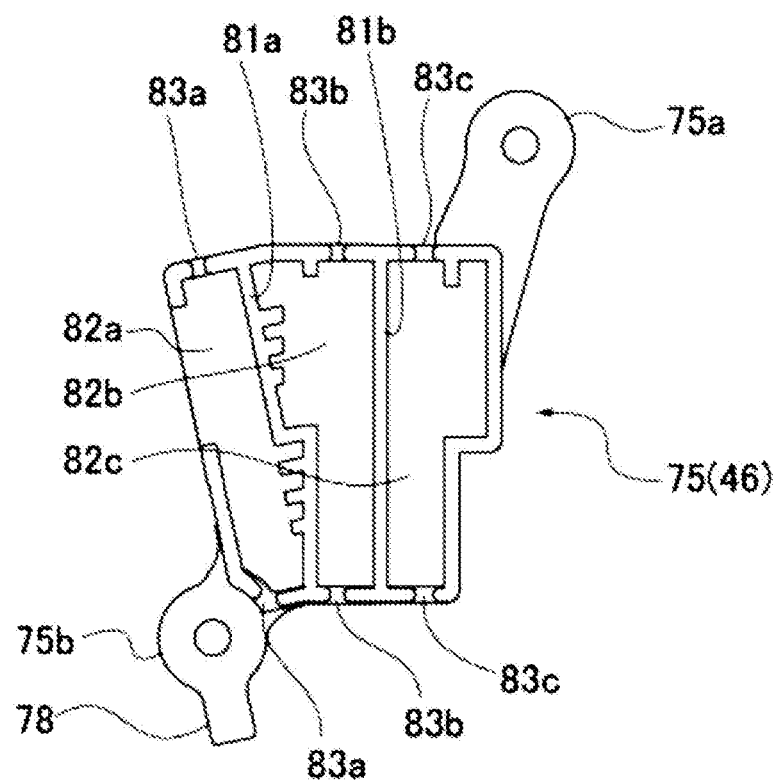
FIG. 3A is a side view of a container portion of FIG. 2A.
Figure 3B:
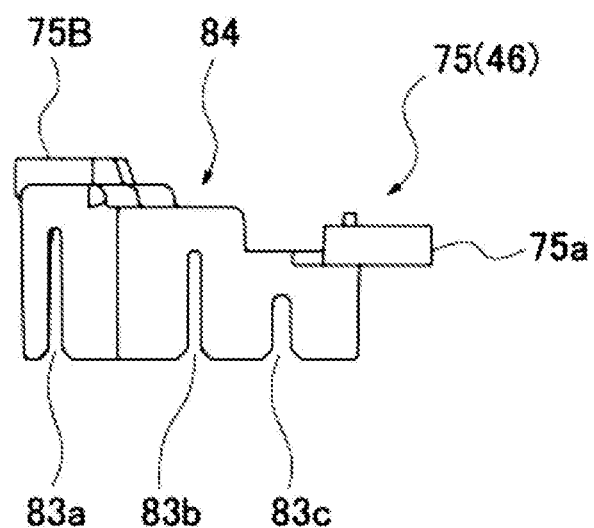
FIG. 3B is a top view of the container portion of FIG. 2A.

(3) As shown in FIGS. 3A and 3B, the receiving portion 46 has a plurality of chambers 82a to 82c partitioned inside thereof. The plurality of chambers 82a to 82c are partitioned by partitions 81a 81b and are configured to receive the plurality of connectors 71a to 71c. In the present embodiment, one of the connectors 71a to 71c is received in each of the chambers 82a to 82c. Alternatively, for example, a plurality of (e.g., two) connectors 71a to 71c may be received in one chamber 82a to 82c (any one thereof).

The partitions 81a, 81b are provided generally along directions of the wirings 72a to 72c. In the case, the receiving portion 46 is partitioned into three chambers arranged generally in the front and rear direction by two partitions 81a, 81b, which extend generally in the vertical direction (second direction 3).

(4) Each of the plurality of chambers 82a to 82c is configured to have a shape matching with a shape of the plurality of connectors 71a to 71c to be received therein. Also, each of the plurality of chambers 82a to 82c is configured to have a different shape to match with a shape of each of the connectors 71a to 71c. Alternatively, depending on shapes of the connectors 71a to 71c to be received (e.g., in a case where all of the connectors 71a to 71c to be received have the same shape, or a case where only some of the connectors 71a to 71c have different shapes), all of the plurality of chambers 82a to 82c may have the same shape or at least two of the plurality of chambers 82a to 82c may have a different shape. Also, similarly to the shapes of the chambers 82a to 82c, the chambers 82a to 82c may configured not only such that all have different sizes, but also such that all have the same size or at least two sizes are employed.

Figure 4:
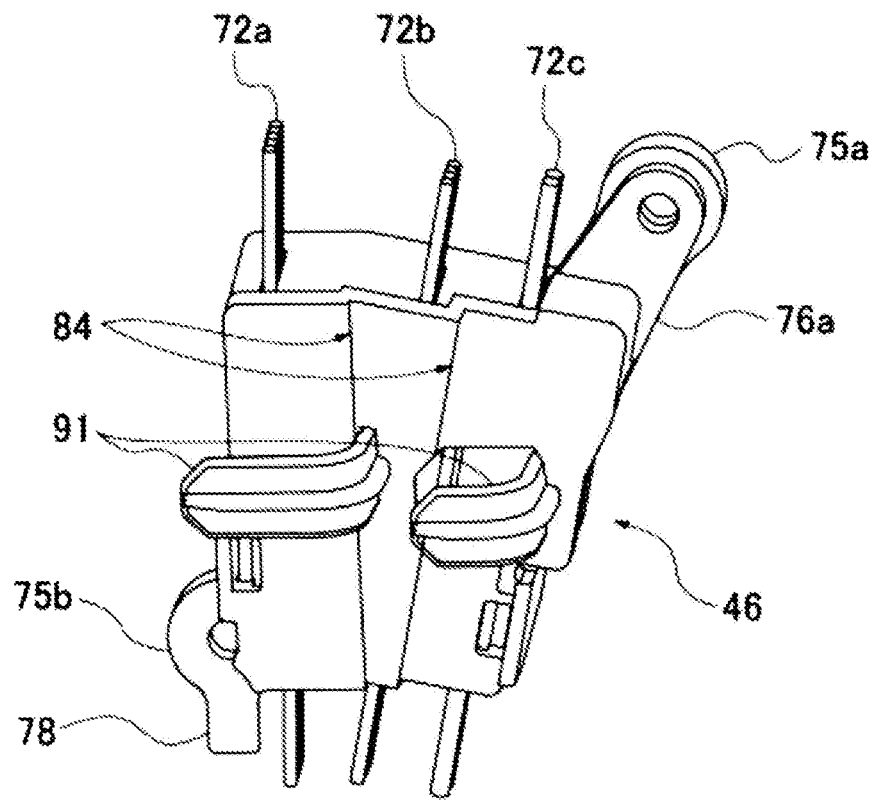
FIG. 4 is an overall perspective view showing a variant of the receiving portion of FIG. 2C.

Herein, the first connector 71a, the second connector 71b and the third connector 71c shown in FIG. 2A have different width dimensions and shapes in accordance with difference in the number or thickness of the wirings 72a to 72c to be connected. Then, the chambers 82a to 82c of the receiving portion 46 are also configured to have different depths or sizes depending on the connectors 71a to 71c. At locations on a peripheral wall portion of the receiving portion 46 (i.e., of the container portion 75 thereof), which correspond to upper and lower portions of each of the chambers 82a to 82c, slits 83a to 83c are provided to allow the wirings 72a to 72c to pass therethrough. Similarly, the slits 83a to 83c are also formed to have different depths or widths depending on the number or thickness of the wirings 72a to 72c. The receiving portion 46 may be configured to have a width dimension based on the widest one of the connectors 71a to 71c. Also, as shown in FIG. 2C, step-shaped portions 84 may be provided on a side surface of the container portion 75 opposite to the opening portion, in accordance with difference in width dimension of the connectors 71a to 71c. Alternatively, as shown in FIG. 4, the step-shaped portions 84 may be provided on the lid portion 76.

Figure 5:
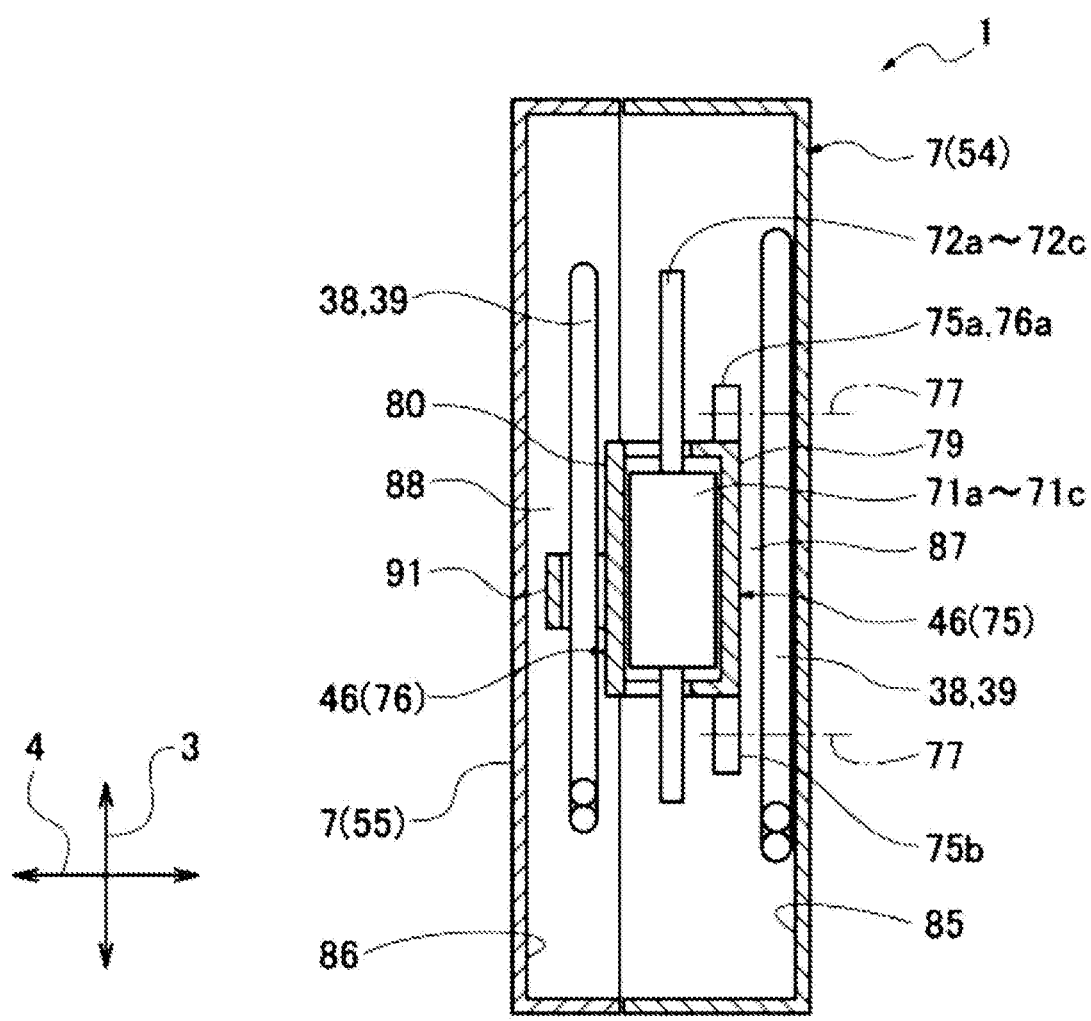
FIG. 5 is a schematic longitudinal sectional view of a body portion of the electric power tool taken at a position of the receiving portion.

(5) As shown in FIG. 5, the receiving portion 46 is fixed to be spaced from inner side walls 85, 86 of the body portion 7. Therefore, predetermined spaces (second receiving portions) 87, 88 are formed between the receiving portion 46 and the inner side walls 85, 86.

Herein, the inner side walls 85, 86 of the body portion 7 means inner walls of side surfaces of the body portion 7, which are oriented in the widthwise (right and left) direction (third direction 4), namely, inner walls of side surfaces of the body portion 7, which are located along a direction substantially perpendicular to an axial direction of the twist motor 27 and also substantially perpendicular to a longitudinal direction of the handle portion 8. By arranging the receiving portion 46 to be spaced from one inner side wall 85, 86 (any one thereof), a predetermined space, i.e., a widthwise gap (second receiving portion) 87, 88 is formed between the receiving portion 46 and the inner side walls 85, 86. Accordingly, wirings (power supply wirings 38, signal wirings 39 and the like) can be arranged to pass through the space or the widthwise gap (second receiving portion) 87, 88. Thus, in the electric power tool of the present embodiment, connectors or wirings can be arranged to pass inside and outside the receiving portion 46, thereby making full use of the empty space in the body portion 7.

(6) The receiving portion 46 includes a first outer surface 79 opposing one inner side wall 85 of the body portion 7 and a second outer surface 80 located opposite to the first outer surface 79 and opposing the other inner side wall 86, and also a wiring holding portion 91 for holding wirings is provided on the second outer surface 80.

For example, the wiring holding portion 91 is configured as a hook portion so that wirings (power supply wirings 38, signal wirings 39 and the like) extending generally in the vertical direction can be received and held therein. For example, the hook portion is configured such that a distal end thereof is bent toward the front side of the body portion 7, although a direction of the hook portion may be set to any direction. By bending the hook portion toward the front side, wirings received in the wiring holding portion 91 can be constrained not to protrude rearward, thereby preventing the wirings from being caught in the rear portion of the body portion 7. One or a plurality of wiring holding portions 91 may be provided. Alternatively, the wiring holding portion 91 may be provided on the first outer surface 79 or on both the first outer surface 79 and the second outer surface 80.

Figure 6:
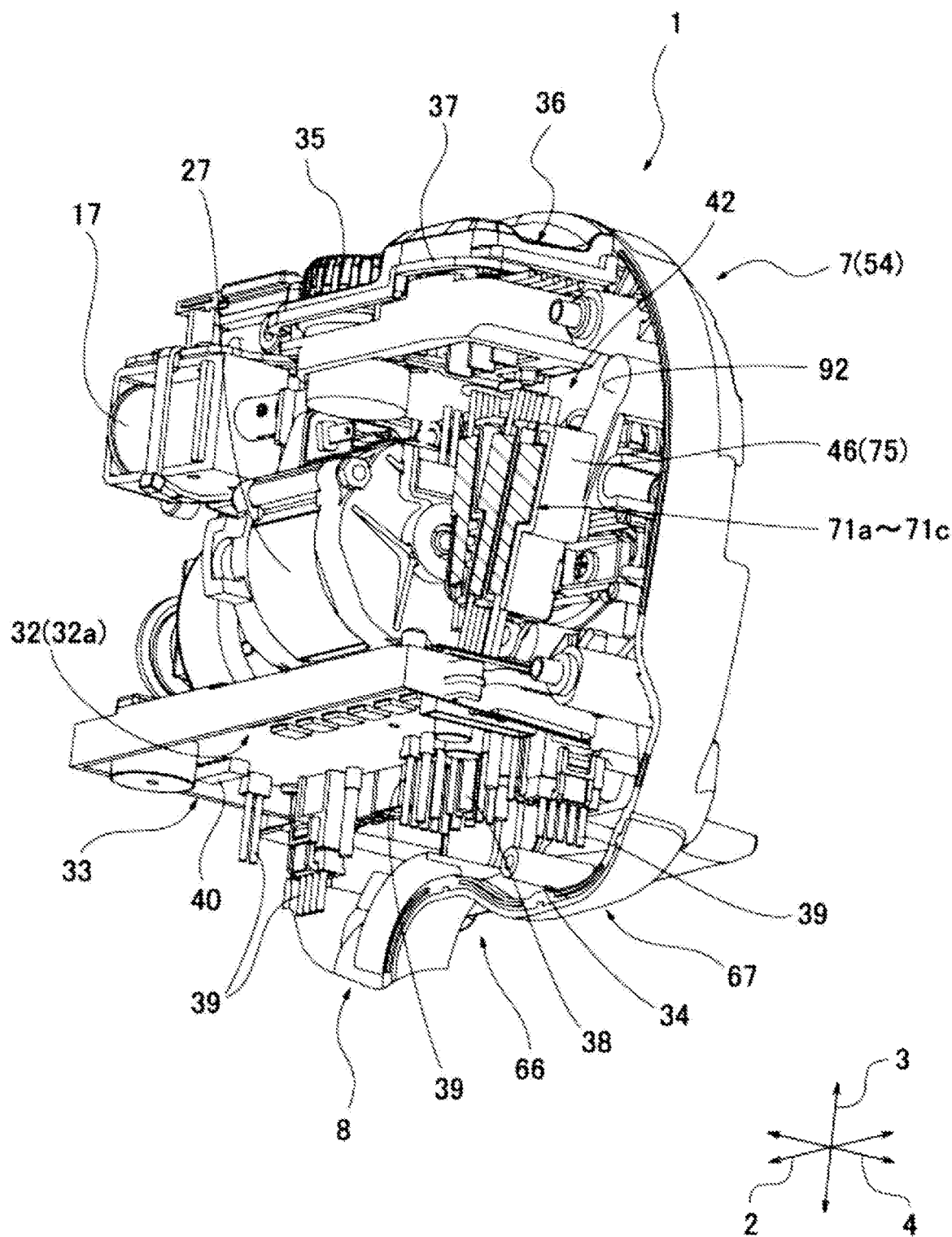
FIG. 6 is a partial perspective view of a rear portion of the body portion of the electric power tool showing another variant of the receiving portion.

(7) As shown in FIG. 6, as another embodiment, the receiving portion 46 may be integrally formed inside the body portion 7.

Herein, the receiving portion 46 can be integrated with the body portion 7, for example, by forming a portion 92 of the container portion 75, which corresponds to the attaching pieces 75*a*, 75*b*, as a connected portion (integrated portion) to the body portion 7 (e.g., the first body portion 54).

Figure 7:
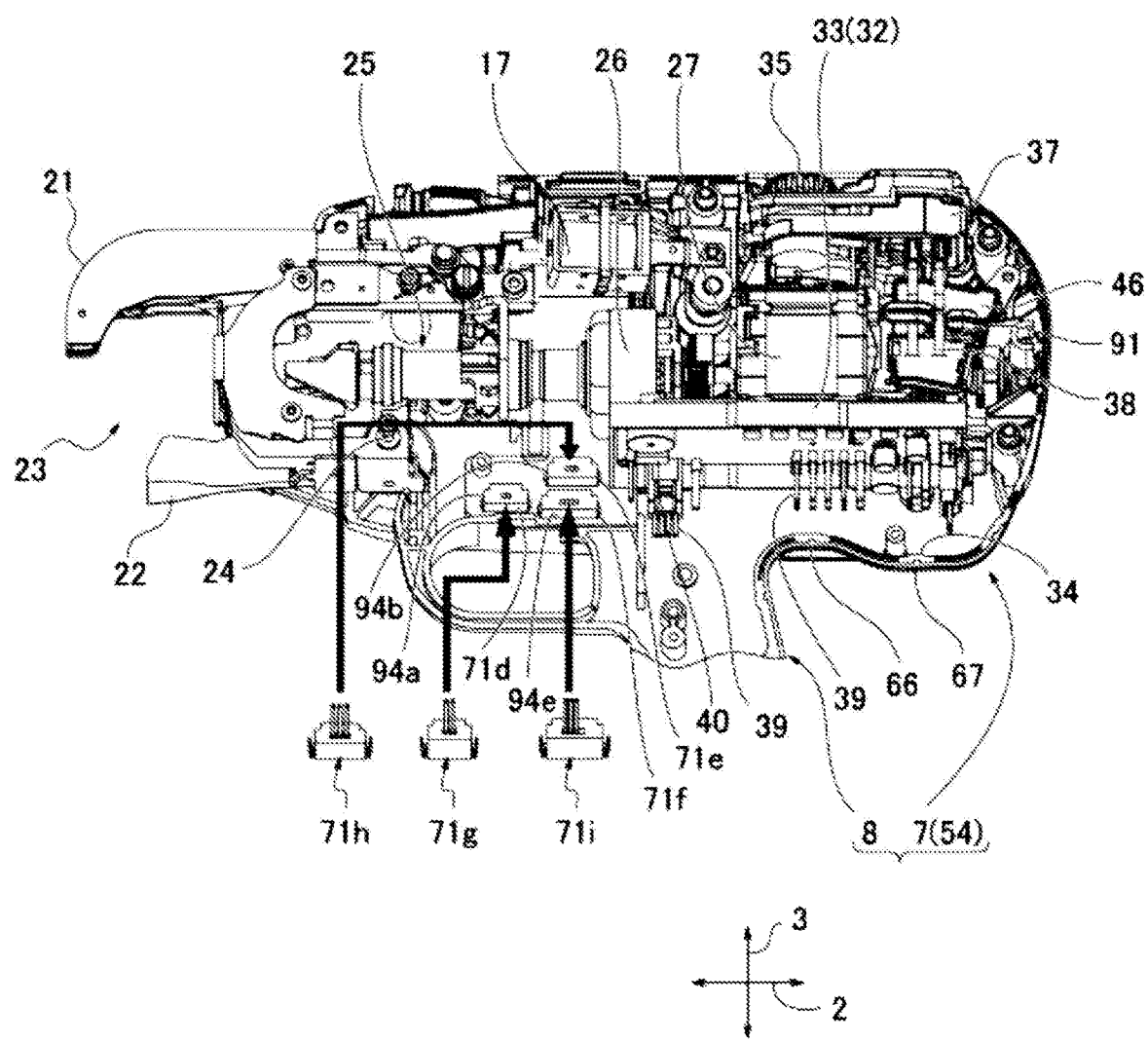
FIG. 7 is a partially enlarged side view of the body portion of the electric power tool showing a connector connection portion, as viewed from the inside thereof.
Figure 8:
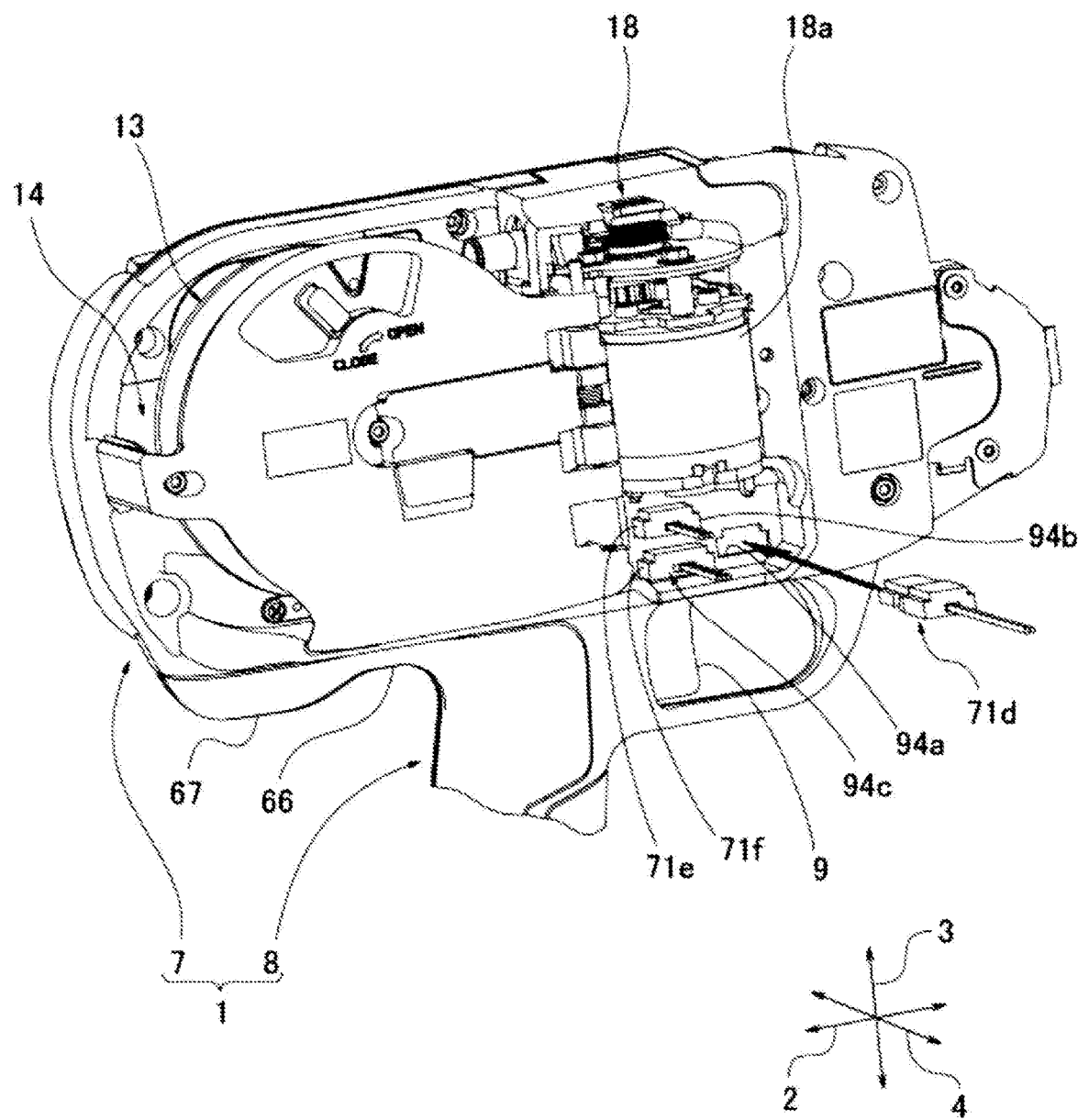
FIG. 8 is a partially enlarged side view of the body portion of the electric power tool showing the connector connection portion, as viewed from the outside thereof.

(8) As shown in FIGS. 7 and 8, the body portion 7 has a plurality of openings (connector connection portions 94*a* to 94*c*) extending from inside to outside of the body portion 7, and the plurality of openings have shapes matching respectively with shapes of a plurality of connectors 71*d* to 71*i* to hold the plurality of connectors 71*d* to 71*i*.

Herein, the connector connection portions 94*a* to 94*c* are provided separately from the receiving portion 46 as described above, but may be provided in place of the receiving portion 46. The connector connection portions 94*a* to 94*c* are formed to be individually matched with the connectors 71*d* to 71*i*, which are different in size or shape in accordance with the number of wirings to be connected, a thickness of wirings, a component (or board) to be connected or the like. Also, male connectors 71*d* to 71*f* are inserted into the connector connection portions 94*a* to 94*c* from the outside or inside of the body portion 7 (e.g., the first body portion 54), and then the male connectors 71*d* to 71*f* are locked on the body portion 7 by claw portions or the like. Then, female connectors 71*g* to 71*i* mating with the male connectors 71*d* to 71*f* are fitted into the male connectors 71*d* to 71*f* from the inside or outside of the body portion 7. Accordingly, the connectors 71*d* to 71*i* are coupled to sandwich the body portion 7 therebetween. Meanwhile, in the present embodiment, the connector connection portions 94*a* to 94*c* are installed in front of the circuit board 32 and the circuit board case 33 and also between the twisting unit 25 and the trigger switch 9.

(9) As shown in FIG. 1, the binding machine (electric power tool) 1 may have wiring protection portions 95, 96 provided inside the body portion 7 for protecting wirings (e.g., power supply wirings 38, signal wirings 39, other wirings and the like).

Figure 9:
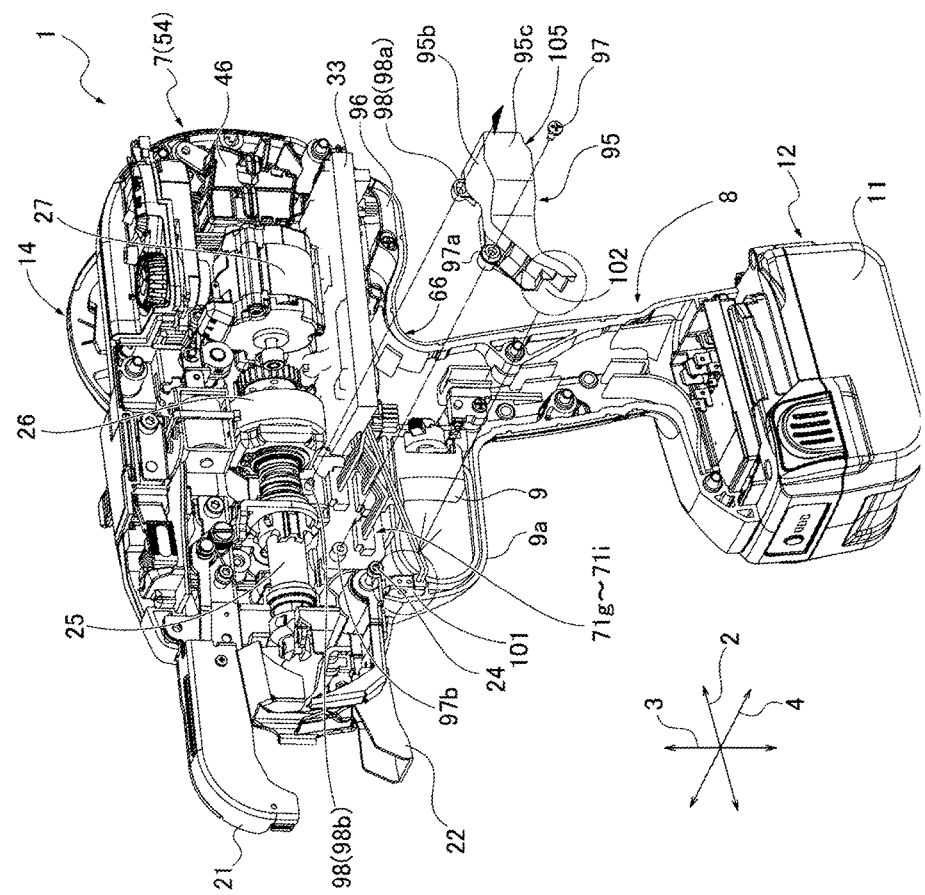
FIG. 9 is an exploded perspective view of the body portion of the electric power tool showing a state of a first wiring protection portion on the front side thereof.
Figure 12:
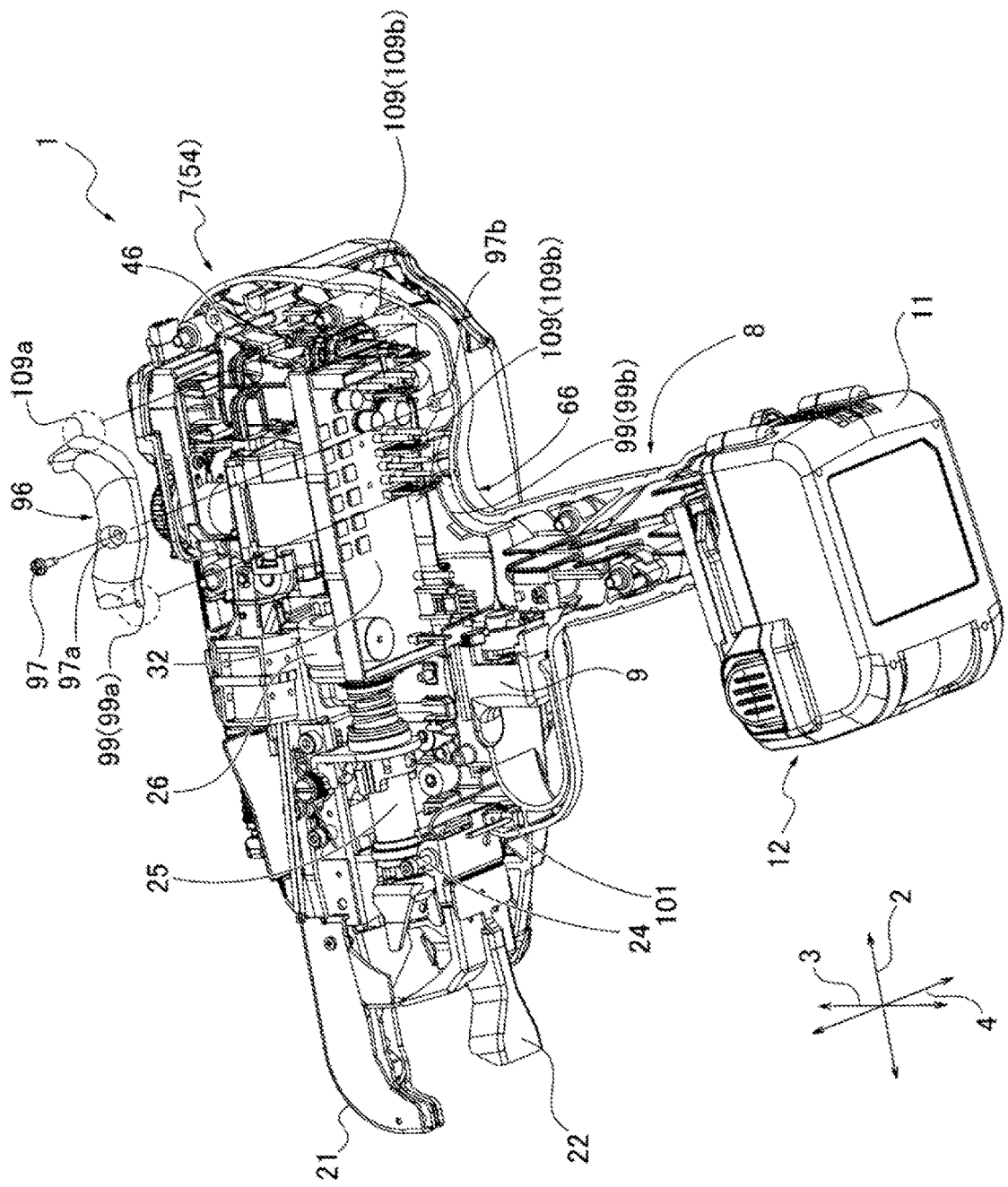
FIG. 12 is an exploded perspective view of the body portion of the electric power tool showing a state of a second wiring protection portion on the rear side of, as viewed obliquely from the rear lower side.
Figure 13A:
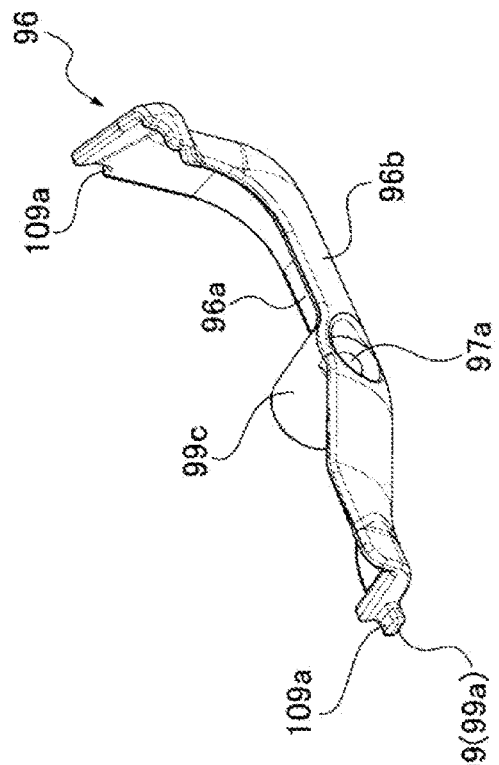
FIGS. 13A to 13C are part views of the second wiring protection portion.
Figure 13C:
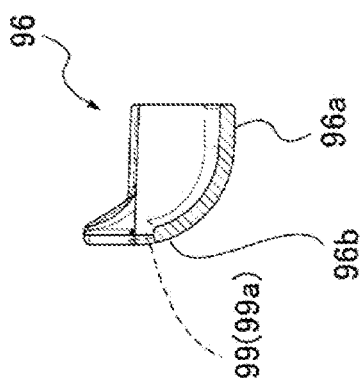
Figure 13B:
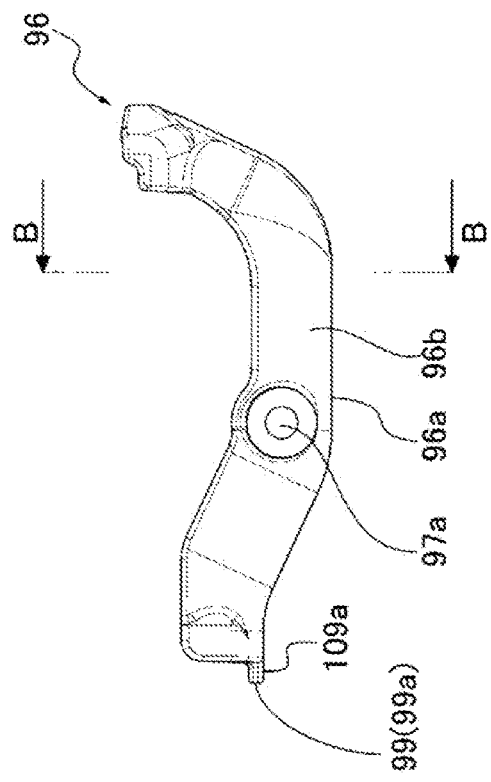

Herein, the wiring protection portions 95, 96 are preferably provided singularly or in plural at a location inside the body portion 7, which is located close to a peripheral edge portion of the body portion 7, to generally extend along the peripheral edge portion of the body portion 7. In the present embodiment, as shown in FIG. 9, a first wiring protection portion 95 is provided at a location on a lower portion of the first body portion 54 constituting the body portion 7, which is located in front of the handle portion 8. Also, as shown in FIG. 12, a second wiring protection portion 96 is provided at a location in the rear of the handle portion 8. For example, the first wiring front-side wiring protection portion 95 can be provided in the vicinity of the trigger switch 9. Also, the second rear-side wiring protection portion 96 can be provided in the recessed portion 66, which is provided in the rear of the handle portion 8, or at a location in the rear of the recessed portion 66.

The wiring protection portions 95, 96 may be formed of an opaque resin member, but is preferably formed of a transparent or translucent resin member so that a state of wirings to be protected and the like can be visible from the outside. The wiring protection portions 95, 96 are fixed to the body portion 7 (e.g., first body portion 54) by fixtures 97 such as screws. Therefore, the wiring protection portions 95, 96 have screw holes 98*a* formed therein. Also, screw supporting portions 97*b*, such as boss portions, allowing the fixtures 97, such as screws, to be screwed therein are provided on the body portion 7 (e.g., the first body portion 54). Preferably, the wiring protection portions 95, 96 are fixed to the body portion 7 by screwing the screws from the third direction 4 (from the left side). The wiring protection portions 95, 96 may be attached on the body portion 7 after the wirings are installed in the body portion 7. Alternatively, the wiring protection portions 95, 96 may be attached on the body portion 7 before the wirings are installed therein, and then the wirings may be installed to extend along the wiring protection portions 95, 96.

Specifically, as shown in FIG. 9, the first front-side wiring protection portion 95 is installed above the trigger switch 9 in such a manner that the female connectors 71*g* to 71*i* inside the body portion 7, which are attached to the connector connection portions 94*a* to 94*c* (see FIG. 7) installed between the twisting unit 25 and the trigger switch 9, or wirings extending from the female connectors 71*g* to 71*i* can be covered and protected therewith from the third direction 4 (from the left side). As shown in the enlarged view of FIG. 10, front and lower sides of the trigger switch 9 are surrounded by a trigger guard 9*a*, and a slide portion 9*b* for guiding forward and rearward movement of the trigger switch 9 is provided at a location within an installation range of the trigger guard 9*a*, which corresponds to a lower edge portion of the body portion 7 (e.g., first body portion 54). Then, the first wiring protection portion 95 is attached at a location above the slide portion 9*b*.

The first wiring protection portion 95 is configured to form a generally closed wiring passage between the body portion 7 and the first wiring protection portion 95 when being attached on the body portion 7. Accordingly, as shown in the part view of FIGS. 11A to D, the first wiring protection portion 95 is a generally C- or U-shaped cross-sectional member having a lower surface portion (first surface portion) 95*a*, an upper surface portion (second surface portion) 95*b*, and a side surface portion 95*c* connecting one-side portions (left portions) of the lower surface portion 95*a* and upper surface portion 95*b*. The first wiring protection portion 95 extends in the front and rear direction (first direction 2) over the entire installation range of the trigger guard 9*a* and has opening portions 95*d*, 95*e* formed between each of front and rear end portions thereof and the body portion 7.

Also, the other-side portions (right portions) of the lower surface portion 95a and upper surface portion 95b are spaced from each other to open therebetween. At least the lower surface portion 95a can be provided, on the other-side portion thereof, with a portion arranged on an upper side of the slide portion 9b at the lower edge portion of the body portion 7 and thus overlapping with the slide portion 9b in the vertical direction. Meanwhile, other configurations of the first wiring protection portion 95 will be described below.

Also, as shown in FIG. 1, the second rear-side wiring protection portion 96 is installed to generally extend along a lower edge portion of the rear portion of the body portion 7 in such a manner that inverted-from-downward-to-upward parts of wirings (power supply wirings 38 or the like), which emerge and extend downward from the rear portion of the circuit board (main board) 32 and then routed upward generally along the rear end portion of the body portion 7 (e.g., first body portion 54), are mainly protected (or pressed) therewith and thus the wirings are prevented from poking out of the body portion 7 (in the third direction 4 (left side), first direction 2 (rear side) or the like). The second wiring protection portion 96 is configured such that, when being attached on the body portion 7, an upright wall capable of constraining the wirings from the left side is formed between the body portion 7 and the second wiring protection portion 96. Also, as shown in the part view of FIGS. 13A to C, in order to form a wiring path opened upward, the second wiring protection portion 96 is a generally L- or J-shaped cross-sectional member having a lower surface portion (first surface portion) 96a and a side surface portion 96b erected upward from one-side portion of the lower surface portion 96a to form the upright wall. The second wiring protection portion 96 extends generally in the front and rear direction (first direction 2) along the recessed portion 66 and a portion in the rear thereof. At least the lower surface portion 96a can be provided, on the other-side portion thereof, with a portion arranged on an upper side of the lower edge portion of the body portion 7 and thus overlapping with the lower edge portion in the vertical direction. Meanwhile, other configurations of the second wiring protection portion 96 will be described below.

(10) As shown in FIG. 1, the wiring protection portions 95, 96 may have rotation restricting portions 98, 99 between the wiring protection portions 95, 96 and the body portion 7. The rotation restricting portions 98, 99 are configured to restrict rotation of the wiring protection portions 95, 96 relative to the body portion 7.

Herein, the rotation restricting portions 98, 99 are intended to restrict rotation of the wiring protection portions 95, 96 in order to prevent the wiring protection portions 95, 96 from being rotated together with the fixtures 97, such as screws, in a screwing direction thereof (e.g., clockwise direction) when the wiring protection portions 95, 96 are fixed to the body portion 7 (e.g., first body portion 54) by the fixtures 97. The rotation restricting portions 98, 99 are preferably provided at locations separated from screwing positions of the fixtures 97.

Specifically, as shown in FIG. 9, the screw hole 97a used for attaching the first wiring protection portion 95 is provided at a location in front of the middle part, in the front and rear direction (first direction 2), of the upper surface portion 95b. Also, the rotation restricting portion 98 for the first wiring protection portion 95 has a rotation restricting concave portion 98a provided at a location in the rear of the middle part, in the front and rear direction, of the upper surface portion 95b, and a rotation restricting convex portion 98b protruding from the body portion 7 (e.g., first body portion 54) toward the rotation restricting concave portion 98a. Then, when the first wiring protection portion 95 is set on the body portion 7, the rotation restricting convex portion 98b is fitted into the rotation restricting concave portion 98a, thereby restricting rotation upon screwing of the fixture 97. The rotation restricting concave portion 98a may be configured as a hole portion, such as a pin hole, provided in the first wiring protection portion 95, and the rotation restricting convex portion 98b may be configured as a protrusion, such as a pin, protruding from the body portion 7. For example, the hole portion can be formed in a convex piece portion protruding upward the upper surface portion 95b of the first wiring protection portion 95. The rotation restricting convex portion 98b can formed to protrude in the left direction (third direction 4) from a location on the body portion 7 (e.g., first body portion 54), which corresponds to the hole portion.

Also, as shown in FIG. 12, the screw hole 97a used for attaching the second wiring protection portion 96 is provided at a location on the substantially middle part, in the front and rear direction, of the second wiring protection portion 96. The location is located in front of the wirings to be protected by the second wiring protection portion 96. Meanwhile, in order to prevent the fixture 97, such as a screw, from being directly in contact with the wirings, a box-shaped cover 99c (see FIGS. 13A to 13C) may be provided around the screw hole 97a. Also, the rotation restricting portion 99 for the second wiring protection portion 96 has a protruding piece portion 99a protruding generally forward from the front end portion of the second wiring protection portion 96, and a rotation restricting rib 99b protruding from the body portion 7 in the left direction (third direction 4). The rib 99b is formed to extend over and along the inner wall surface 34 of the lower edge portion of the body portion 7 in such a manner that a gap substantially equal to a thickness of the protruding piece portion 99a is defined therebetween. Accordingly, when the second wiring protection portion 96 is set on the body portion 7, the protruding piece portion 99a can be inserted and held (or sandwiched) between the rib 99b and the lower edge portion of the body portion 7. The rib 99b and the lower edge portion of the body portion 7 constitute a sandwiching portion capable of sandwiching the protruding piece portion 99a. Then, when the second wiring protection portion 96 is set on the body portion 7, the protruding piece portion 99a is sandwiched between the rib 99b and the lower edge portion of the body portion 7, thereby restricting rotation upon screwing of the fixture 97.

(11) In the following, other configurations of the first wiring protection portion 95 will be described.

(a) As shown in FIG. 9 (to FIG. 11D), a sensor 101 for detecting pivoting of the lower curl guide 22 about the curl guide shaft 24 in the vertical direction is provided in the vicinity of the front end portion of the first wiring protection portion 95. For example, the sensor 101 may be configured as a push switch or the like. The sensor 101 is installed to be received at a location on the front upper portion of the trigger guard 9a. Also, the first wiring protection portion 95 may be provided, in the vicinity of the front end portion thereof, with a retaining portion 102 (sensor retainer) for preventing the sensor 101 from falling out of the body portion 7. The retaining portion 102 is configured as a locking portion for retaining (locking and holding) a left surface of the sensor 101 from the left side. The locking portion is formed by providing a convex-shaped portion, which has a length reaching the left surface of the sensor 101, on a distal end portion of the first wiring protection portion 95. By providing the convex-shaped portion, the distal end portion of the first wiring protection portion 95 has a stepped or cutout shape at the lower surface portion 95a or upper surface portion 95b. Accordingly, the sensor 101 can be retained by the stepped or cutout-shaped distal end portion. In this way, by providing the retaining portion 102 on the first wiring protection portion 95, it is possible to prevent the sensor 101 from falling out of the body portion 7 (or the front upper portion of the trigger guard 9a). Further, since the first wiring protection portion 95 is fixed to the body portion 7, the sensor 101 can be stably held between the body portion 7 and the retaining portion 102.

(b) The first wiring protection portion 95 may be provided with an enlarged cross-section portion 105 for preventing wirings to be protected from being sharply bent. In the present embodiment, wirings extending from the female connectors 71g to 71i in the third direction 4 (left direction) are greatly reversed to be routed in the right direction immediately after that. Subsequently, the wirings pass by front of a front side portion of the circuit board case 33 and then are guided to an inner portion of the body portion 7 (e.g., the first body portion 54) (i.e., to the right side of the circuit board case 33). At this time, if the wirings are excessively bent, there is a risk that defects, such as disconnection, occur in the wirings. Therefore, in order to maintain the bent section of the wirings in a more gentle shape, a cross section of the first wiring protection portion 54, in which the bent section of the wirings and the vicinity thereof are arranged, is enlarged toward the third direction 4 to form the enlarged cross-section portion 105. The enlarged cross-section portion 105 can be formed to have a desired size within a width range of the body portion 7 in the third direction 4. In the present embodiment, the enlarged cross-section portion 105 is shaped in such a manner that the cross section of the first wiring protection portion 95 is enlarged toward the left side as it goes rearward. Meanwhile, the position or shape of the enlarged cross-section portion 105 of the first wiring protection portion 95 can be appropriately changed depending on a bent shape of the wirings. In this way, by providing the enlarged cross-section portion 105 on the first wiring protection portion 95, it is possible to reliably guide and protect wirings to be protected while protecting the wirings from being sharply bent.

Figure 10:
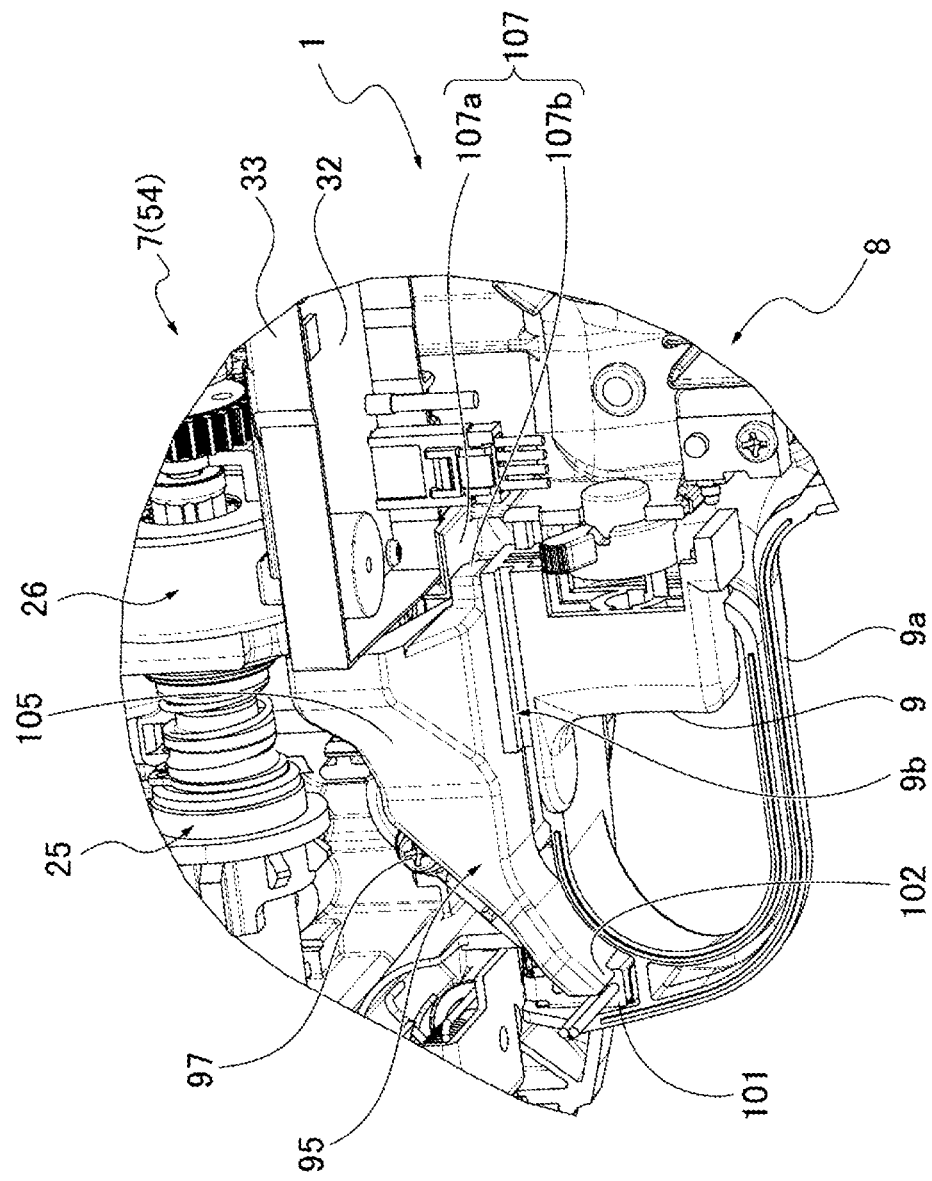
FIG. 10 is an enlarged perspective view of the vicinity of the trigger switch of FIG. 9.
Figure 11A:
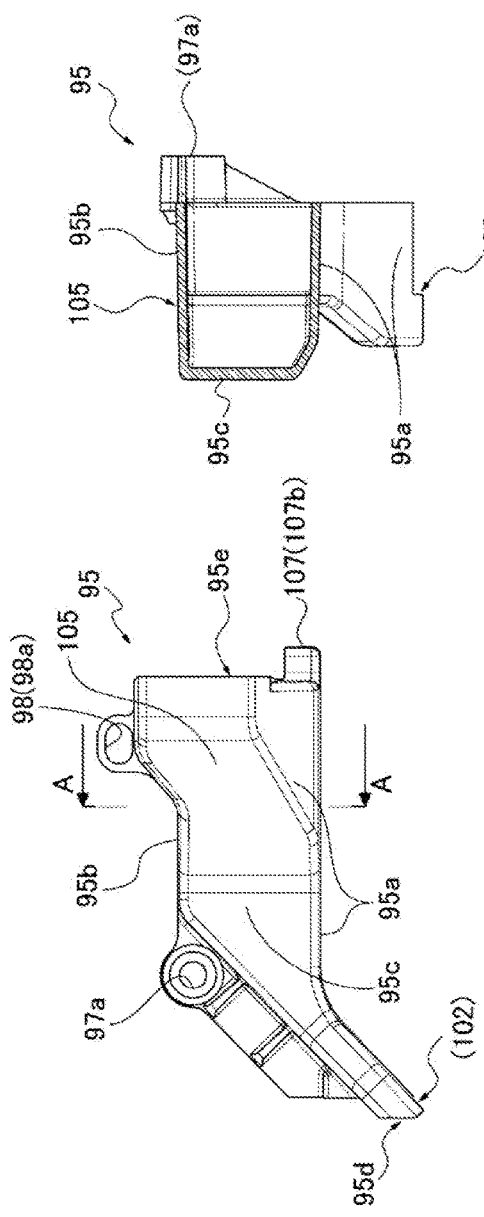
FIGS. 11A to 11D are part views of the first wiring protection portion.
Figure 11B:
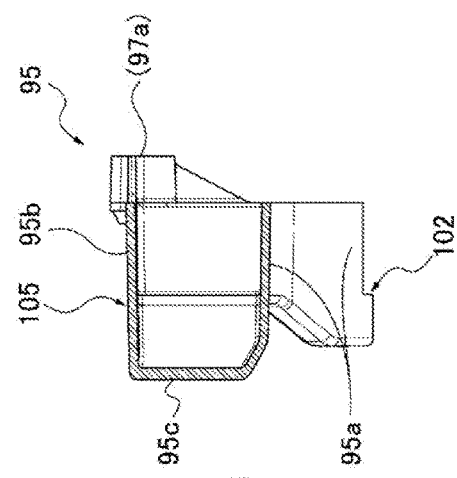
Figure 11C:
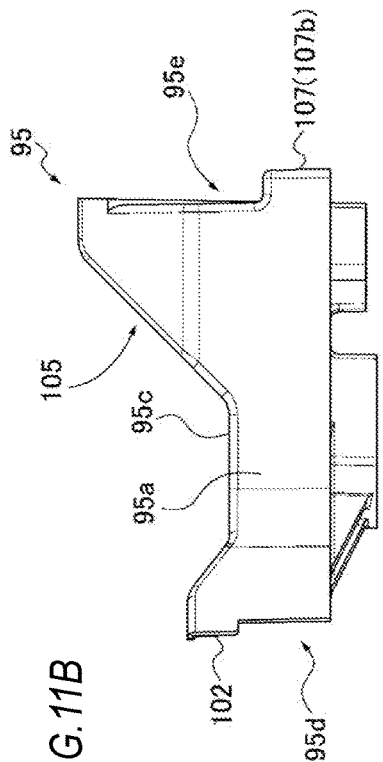
Figure 11D:
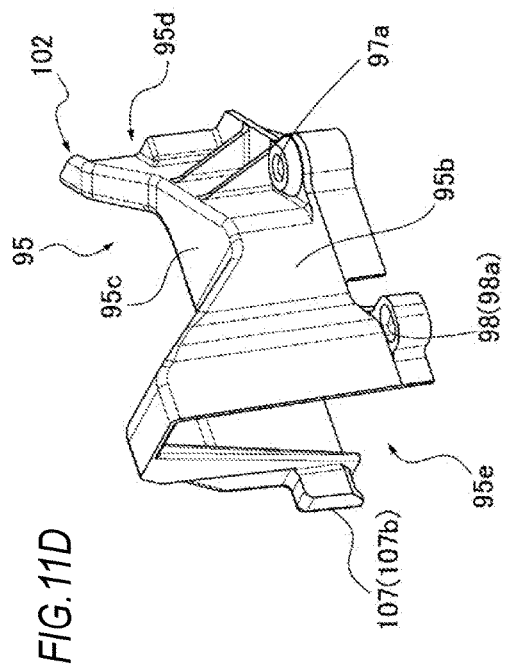

(c) As shown in FIG. 10, a shape correction portion 107 capable of maintaining the first wiring protection portion 95 in a normal shape may be provided between the first wiring protection portion 95 and the body portion 7 (e.g., the first body portion). The shape correction portion 107 is intended to restore the first wiring protection portion 95 to the normal shape, for example, in a case where the first wiring protection portion 95 is shrunk after molding, thereby ensuring that the first wiring protection portion 95 can be attached on the body portion 7 without any trouble. Specifically, a cross section of the first wiring protection portion 95 taken in a plane perpendicular to the first direction 2 (front and rear direction) has a generally C- or U-shape. Accordingly, due to shrinkage, the other-side portions of the upper surface portion 95b and lower surface portion 95a are easy to be closed toward each other in the vertical direction. Therefore, the shape correction portion 107 can be configured to open the closed first wiring protection portion 95 in the vertical direction, thereby restoring the original shape thereof. In particular, the first wiring protection portion 95 is easy to be closed at the front and rear end portions and also at the position of the enlarged cross-section portion 105 due to shrinkage. Therefore, the shape correction portion 107 is preferably provided on at least one of the vicinity of the front and rear end portions and the vicinity of the enlarged cross-section portion 105. In the present embodiment, the shape correction portion 107 is provided on the rear end-side portion provided with the enlarged cross-section portion 105 and the like.

Specifically, the shape correction portion 107 is configured as a protrusion, such as a rib 107a, provided on the body portion 7 for opening the first wiring protection portion 95. The rib 107a abuts against an upper surface of the lower surface portion 95a of the first wiring protection portion 95, which is located in the vicinity of the rear end portion thereof, thereby widening the first wiring protection portion 95 and thus preventing biting of wirings. The rib 107a extends from the body portion in the left direction (third direction 4). On the other hand, if necessary, a rib bearing portion 107b configured to surface-abut against the rib 107a may be provided as the shape correction portion 107 on a portion of the lower surface portion 95a of the first wiring protection portion 95, which is located toward the rear end portion thereof. In the present embodiment, the rib bearing portion 107b is configured as a protruding piece protruding rearward from the lower surface portion 95a. The rib bearing portion 107b can be formed to be thicker than other portions of the first wiring protection portion 95 in order to finely adjust an abutting position thereof against the abutting portion 107a, to secure a required strength and the like.

In this way, since the shape correction portion 107 is provided between the first wiring protection portion 95 and the body portion 7 (e.g., first body portion 54), it is possible to restore (open) the shrunken first wiring protection portion 95 to the normal shape by simply setting the first wiring protection portion 95 on the body portion 7 and then surface-abutting the rib bearing portion 107b against the rib 107a. Therefore, it can be ensured that the first wiring protection portion 95 (the lower surface portion 95a thereof) is positioned at a defined location on the body portion 7. Meanwhile, with respect to the upper surface portion 95b of the first wiring protection portion 95, the rotation restricting portion 98 serves as a reference for an attaching position thereof and also as the shape correction portion 107, thereby ensuring that the upper surface portion 95b is installed at a correct position.

(12) In the following, other configurations of the second wiring protection portion 96 will be described.

As shown in FIG. 12, a sinking prevention portion 109 for preventing the second wiring protection portion 96 from sinking down into the body portion 7 may be provided between the body portion 7 (e.g., first body portion 54) and the second wiring protection portion 96. If a restoring force of wirings, which have been pushed and bent by the second wiring protection portion 96 when the second wiring protection portion 96 has been set on the body portion 7, causes one side (front or rear side), in the front and rear direction (first direction 2), of the second wiring protection portion 96 to be lifted toward the near side in the third direction (left direction), the other side (rear or front side) is pushed into the body portion 7 toward the far side in the third direction (right direction), thereby causing sinking of the second wiring protection portion 96. The sinking prevention portion 109 may be configured as front and rear stoppers 109b or displacement restricting portions provided, respectively, at locations on the body portion 7, which correspond, respectively, to front and rear end portions of the second wiring protection portion 96, so that the front and rear end portions of the second wiring protection portion 96 are born thereon in the third direction 4. The stoppers 109b can be formed as ribs, ridges or the like for restricting, respectively, the front and rear end portions of the second wiring protection portion 96 so as not to be displaced toward the far side in the third direction 4 by more than a predetermined amount. The ribs or ridges for the stoppers protrude from the body portion 7 in the left direction (third direction 4) to have a height preventing the second wiring protection portion 96 from being displaced more toward the far side than the correct position thereof. On the other hand, on at least one of the front and rear end portions of the second wiring protection portion 96, a bearing portion 109a can be appropriately provided to stably bear the front and rear stoppers 109b with respect to the third direction 4. In the present embodiment, the front bearing portion 109a is formed on a portion (side surface) of the protruding piece portion 99a constituting the rotation restricting portion 99, which faces the body portion 7 (e.g., the first body portion 54). This front sinking prevention portion 109 is integrally formed with the rib 99b of the rotation restricting portion 99. Also, the rear bearing portion 109a is formed as a cutout portion formed in the lower surface portion 95a.

<Operation> Hereinafter, operation of the present embodiment will be described.

The reel 13 having the wire 6 wound thereon is mounted on the mount portion 14, and then the main switch 36 is turned on. In this state, the distal end of the body portion 7 is oriented toward reinforcing bars 5, the reinforcing bars 5 are inserted between the upper and lower curl guides 21, 22, and then the trigger switch 9 is pulled. As a result, the wire feeding unit 18 is activated so that the wire 6 is drawn out from the reel 13 and then is delivered to the front side of the body portion 7. The wire 6 delivered to the front side of the body portion 7 is curled by the curl guides 21, 22 and also guided to be wrapped in one turn or a plurality of turns around the reinforcing bars 5. Thereafter, the loop-shaped wire 6 wound around the reinforcing bars 5 is twisted by the twisting unit 25, so that a diameter of the loop is reduced, thereby binding the reinforcing bars 5.

The electric power tool, such as the binding machine 1 as described above, includes, in the body portion 7, the driving unit, such as a motor; various components, such as sensors or LEDs; the circuit board 32, on which the control unit 40 is mounted; the connectors 71a to 71c for electrically connecting therebetween and the like. If the body portion 7 has only a structure, in which the connectors 71a to 71c are simply pushed into the inside of the body portion 7 when routing the wirings 72a to 72c, assemblability or maintainability to the body portion 7 is deteriorated.

<Effects> Accordingly, the above configurations of the present embodiment, can obtain the following effects.

(Effect 1) The plurality of connectors 71a to 71c are received and held in the receiving portion 46, and then the receiving portion 46 is fixed to the body portion 7. Therefore, it is possible to enhance assemblability and maintainability of the plurality of connectors 71a to 71c to the body portion 7. Since the plurality of connectors 71a to 71c are collectively received in the receiving portion 46, a receiving space, which has to be secured in the body portion 7 in order to receive the plurality of connectors 71a to 71c, can be reduced, thereby allowing downsizing of the body portion 7. Since the receiving portion 46 is fixed to the body portion 7, the connectors 71a to 71c received in the receiving portion 46 are hardly shaken due to vibration or the like, thereby making it difficult for the connectors 71a to 71c to be damaged. Therefore, it is possible to enhance quality performance of the electric power tool.

(Effect 2) The receiving portion 46 is arranged in the rear of the driving unit, i.e., on the opposite side to the output shaft of the twist motor 27. Therefore, a part of the electric power tool, which serves as a tool (twisting unit 25 in the case of the binding machine 1 and the like), can be arranged in front of the body portion 7, the driving unit can be arranged in the rear of the body portion 7, the circuit board 32 can be arranged to be close to the driving unit, and also the receiving portion 46 can be arranged in the rear space 42 in the rear of the twist motor 27. As a result, the empty space in the rear of the twist motor 27 can be effectively utilized. Also, distances among various components and the circuit board 32 and the connectors 71a to 71c are shortened, thereby facilitating arranging or routing of the connectors 71a to 71c in the body portion 7. Therefore, it is possible to downsize the body portion 7 and to enhance operability of the electric power tool.

(Effect 3) The plurality of chambers 82a to 82c are provided inside the receiving portion 46. Therefore, the connectors 71a to 71c can be received in the plurality of chambers 82a to 82c, or the plurality of connectors 71a to 71c can be individually received and fixed therein. As a result, it is possible to enhance assemblability and maintainability of the connectors 71a to 71c to the receiving portion 46. Also, the plurality of chambers 82a to 82c are partitioned by the partitions 81a, 81b, thereby preventing the plurality of connectors 71a to 71c from interfering with each other inside the receiving portion 46. Thus, it is possible to suppress the plurality of connectors 71a to 71c from being shaken due to vibration or the like, thereby making it difficult for the connectors 71a to 71c to be damaged. Therefore, it is possible to enhance quality performance of the electric power tool.

(Effect 4) The shapes of the plurality of chambers 82a to 82c match respectively with the shapes of the plurality of connectors 71a to 71c to be received therein. Therefore, the connectors 71a to 71c can be individually fitted into the respective chambers 82a to 82c, so that the connectors 71a to 71c are not shaken due to vibration or the like, thereby making it difficult for the connectors 71a to 71c to be damaged. Thus, it is possible to enhance quality performance of the electric power tool. Also, the plurality of chambers 82a to 82c are configured to have different shapes to match with the shapes of the connectors 71a to 71c. Therefore, connectors having different shapes can be used as the plurality of connectors 71a to 71c, thereby preventing the connectors 71a to 71c from being misassembled.

(Effect 5) The receiving portion 46 is fixed to be spaced from the inner side walls 85, 86 of the body portion 7. Thus, the second receiving portions 87, 88 are formed between the receiving portion 46 and the inner side walls 85, 86. Therefore, wirings (power supply wirings 38, signal wirings 39 and the like) installed inside the body portion 7 can be held by the second receiving portions 87, 88. Also, the connectors 71a to 71c (and thus the wirings 72a to 72c having the connectors 71a to 71c) and the other wirings can be separated to be hierarchically held in the inside and outside of the receiving portion 46. Accordingly, it is possible to enhance assemblability and maintainability of the connectors 71a to 71c or the wirings to the body portion 7.

(Effect 6) The wiring holding portion 91 is provided on the outer surfaces 79, 80 of the receiving portion 46, which oppose the inner side walls 85, 86 of the body portion 7. In particular, the wiring holding portion 91 is provided on the second outer surface 80 of the receiving portion 46. Therefore, by using the wiring holding portion 91, the wirings (power supply wirings 38, signal wirings 39 and the like) and the connectors 71a to 71c (and thus the wirings 72a to 72c having the connectors 71a to 71c) can be separated to be hierarchically received and held in the inside and outside of the receiving portion 46. In the electric power tool of the present embodiment, the second receiving portion 87, the receiving portion 46 and the wiring holding portion 91 are provided in the widthwise direction of the body portion 7, thereby forming a receiving space having a three-layered structure. Also, since the connectors 71a to 71c can be held by the receiving portion 46 and the wirings (power supply wirings 38, signal wirings 39 and the like) can be held by the second receiving portion 46 and the wiring holding portion 91, a space in the body portion 7 can be effectively utilized and thus the body portion 7 can be further compacted. Also, by receiving the connectors 71a to 71c or the wirings as described above, it is possible to enhance assemblability and maintainability of the connectors 71a to 71c or the wirings to the body portion 7. Meanwhile, although in the electric power tool of the present embodiment, three layers of spaces are provided in the widthwise direction of the body portion 7 and the connectors 71a to 71c or the wirings are received therein, the receiving portion 46 may be brought close, for example, to the inner side wall 85 of the body portion 7, so that the second receiving portion 87 is not provided between the receiving portion 46 and the inner side wall 85, thereby providing a two-layered structure including the receiving portion 46 and the wiring holding portion 91.

(Effect 7) The receiving portion 46 may be integrally formed inside the body portion 7. Therefore, it is not necessary to form the receiving portion 46 as a separate member, thereby enhancing assemblability of the connectors 71a to 71c to the body portion 7.

(Effect 8) The plurality of openings extending from inside to outside of the body portion 7 may be provided in the body portion 7 and the plurality of openings may serve as connector connection portions 94a to 94c having shapes matching with shapes of a plurality of connectors 71d to 71i respectively. Therefore, connectors having different shapes can be used as the plurality of connectors 71d to 71i, thereby preventing the connectors 71d to 71i from being misassembled in the connector connection portions 94a to 94c1. Since the plurality of openings provided in the body portion 7 are used as the connector connection portions 94a to 94c, the connectors 71d to 71i can be directly held on the body portion 7. Thus, the connectors 71d to 71i can have a structure robust against vibration, thereby enhancing assemblability and maintainability of the connectors 71d to 71i to the body portion 7. Further, by using the connector connection portions 94a to 94c, wirings 72a to 72c extending from inside to outside of the body portion 7 can be easily provided.

(Effect 9) The wiring protection portions 95, 96 may be provided inside the body portion 7. Therefore, wirings arranged inside the body portion 7 can be protected by the wiring protection portions 95, 96. In the inside of the body portion 7, the wiring protection portions 95, 96 can serve as wiring guides for guiding the wirings to correct paths, maintaining the wirings in an orderly arranged state, or routing the wirings to prevent defects of the wirings, such as disconnection, due to excessive bending thereof. Also, for example, by providing the wiring protection portions 95, 96 generally along the peripheral edge portion of the body portion 7, it is possible to prevent the wirings from being caught in the body portion 7 when the body portion 7 (i.e., the first body portion 54 and the second body portion 55) is closed. Further, for example, by providing the wiring protection portion 95 in the vicinity of the trigger switch 9, it is possible to prevent the wirings from being caught in the slide portion 9b of the trigger switch 9 and the like. In addition, by providing the wiring protection portion 96 in the recessed portion 66 or in the rear of the recessed portion 66, it is possible to facilitate routing of the wirings in a narrow portion of the rear portion of the body portion 7 and the like. Further, the wiring protection portions 95, 96 can prevent the wirings from moving inside the body portion 7.

(Effect 10) The wiring protection portions 95, 96 may be provided with the rotation restricting portions 98, 99 for restricting rotation of the wiring protection portions 95, 96 relative to the body portion 7. Therefore, the rotation restricting portions 98, 99 can restrict rotation of the wiring protection portions 95, 96 relative to the body portion 7 when the wiring protection portions 95, 96 are attached, thereby preventing positions of the wiring protection portions 95, 96 from being shifted. As a result, it is possible to facilitate attaching of the wiring protection portions 95, 96.

1: Binding machine (electric power tool) 7: Body portion 9: Trigger switch (component) 17: Solenoid (driving unit) 27: Twist motor (driving unit) 32: Circuit board 35: Setting unit (component) 36: Main switch (component) 40: Control Unit 46: Receiving portion 71a to 71i: Connector 72a to 72c: Wiring 79: First outer surface 80: Second outer surface 81a, 81b: Partition 82a to 82c: Chamber 85, 86: Inner side wall 87, 88: Second receiving portion 91: Wiring holding portion 94a to 94c: Connector connection portion 95, 96: Wiring protection portion 98, 99: Rotation restricting portion

The invention claimed is:

1. An electric power tool comprising:
   a driving unit generating a driving force by electricity and various components functioning by electricity;
   a circuit board on which a control unit configured to control the driving unit and the various components is mounted;
   a plurality of connectors connecting a plurality of wirings, which extend from the driving unit and the various components, with a plurality of wirings, which extend from the circuit board;
   a body portion installed therein with the driving unit, the various components, the circuit board and the plurality of connectors; and
   a receiving portion which receives the plurality of connectors therein and which is fixed to the body portion.

2. The electric power tool according to claim 1,
   wherein the driving unit comprises a motor having an output shaft protruding from one end side of the motor, and
   wherein the receiving portion is arranged on an opposite side to the output shaft of the motor.

3. The electric power tool according to claim 1,
   wherein the receiving portion has a plurality of chambers partitioned inside thereof, and
   wherein the plurality of chambers are configured to be capable of receiving the connectors.

4. The electric power tool according to claim 3,
   wherein the plurality of chambers respectively receive the plurality of connectors to be received.

5. The electric power tool according to claim 4,
   wherein the plurality of chambers are configured to have a shape matching with a shape of the respective connectors to be received.

6. The electric power tool according to claim 3,
   wherein the plurality of chambers are configured to have different shapes.

7. The electric power tool according to claim 1,
   wherein a wiring holding portion capable of holding a wiring is provided on an outer surface of the receiving portion opposing an inner side wall of the body portion.

8. The electric power tool according to claim 1, wherein the receiving portion is fixed to be spaced from an inner side wall of the body portion.

9. The electric power tool according to claim 8, wherein the receiving portion comprises:
a first outer surface opposing the inner side wall of the body portion; and
a second outer surface located opposite to the first outer surface,
wherein a wiring holding portion capable of holding a wiring is provided on the second outer surface.

10. The electric power tool according to claim 1, wherein the receiving portion is integrally formed inside the body portion.

11. The electric power tool according to claim 1, wherein the body portion has a plurality of openings extending from inside to outside thereof, and
wherein the plurality of openings have a shape matching with a shape of the respective connectors to be capable of holding the respective connectors.

12. The electric power tool according to claim 1, wherein a wiring protection portion capable of protecting the wirings is provided inside the body portion.

13. The electric power tool according to claim 12, wherein the wiring protection portion has a rotation restricting portion configured to restrict rotation of the wiring protection portion relative to the body portion.

* * * * *